US009972335B2

(12) United States Patent
Takahashi et al.

(10) Patent No.: US 9,972,335 B2
(45) Date of Patent: May 15, 2018

(54) SIGNAL PROCESSING APPARATUS, SIGNAL PROCESSING METHOD, AND PROGRAM FOR ADDING LONG OR SHORT REVERBERATION TO AN INPUT AUDIO BASED ON AUDIO TONE BEING MODERATE OR ORDINARY

(71) Applicant: SONY CORPORATION, Tokyo (JP)

(72) Inventors: Naoya Takahashi, Tokyo (JP); Masayoshi Noguchi, Chiba (JP); Masashi Fujihara, Kanagawa (JP); Kazuki Sakai, Tokyo (JP); Kaneaki Fujishita, Chiba (JP)

(73) Assignee: SONY CORPORATION, Tokyo (JP)

( * ) Notice: Subject to any disclaimer, the term of this patent is extended or adjusted under 35 U.S.C. 154(b) by 298 days.

(21) Appl. No.: 14/535,569

(22) Filed: Nov. 7, 2014

(65) Prior Publication Data

US 2015/0142445 A1 May 21, 2015

(30) Foreign Application Priority Data

Nov. 19, 2013 (JP) ................................ 2013-239187

(51) Int. Cl.

| | |
|---|---|
| ***H03G 3/00*** | (2006.01) |
| ***H04R 3/00*** | (2006.01) |
| ***G10L 21/02*** | (2013.01) |
| ***H04H 60/47*** | (2008.01) |
| ***G10L 21/00*** | (2013.01) |
| *G10K 15/10* | (2006.01) |
| *G10L 25/69* | (2013.01) |
| *G10L 21/0316* | (2013.01) |
| *G10L 25/51* | (2013.01) |
| *G10L 25/81* | (2013.01) |

(52) U.S. Cl.
CPC .......... *G10L 21/0202* (2013.01); *G10L 21/00* (2013.01); *H04H 60/47* (2013.01); *G10H 2210/046* (2013.01); *G10H 2210/281* (2013.01); *G10H 2210/301* (2013.01); *G10K 15/10* (2013.01); *G10L 21/0316* (2013.01); *G10L 25/51* (2013.01); *G10L 25/69* (2013.01); *G10L 25/81* (2013.01)

(58) Field of Classification Search
CPC ......... H04H 60/47; G10K 15/10; G10L 25/69
USPC ............................................. 381/61, 63, 111
See application file for complete search history.

(56) References Cited

U.S. PATENT DOCUMENTS 4,731,835 A * 3/1988 Futamase ............. G10H 1/0091 381/63
5,119,428 A * 6/1992 Prinssen ................ G10K 15/10 381/63

(Continued)

FOREIGN PATENT DOCUMENTS

JP 2011-150143 A 8/2011

*Primary Examiner* — Farzad Kazeminezhad
(74) *Attorney, Agent, or Firm* — Chip Law Group

(57) ABSTRACT

Provided is a signal processing apparatus including a feature detection unit configured to detect, from an input signal, a detection signal including at least one of audience-generated-sound likelihood and music likelihood, a reverberation adding unit configured to add long or short reverberations to the input signal based on a detected tone being moderate or ordinary tone respectively, and a vicinity-sound generation unit configured to generate vicinity sound based on the detection signal.

12 Claims, 28 Drawing Sheets

(56) References Cited

U.S. PATENT DOCUMENTS

| | | | | |
|---|---|---|---|---|
| 8,098,833 | B2 * | 1/2012 | Zumsteg | G10L 25/69 381/111 |
| 2005/0281410 | A1 * | 12/2005 | Grosvenor | H04H 60/47 381/61 |
| 2011/0035213 | A1 * | 2/2011 | Malenovsky | G10L 25/78 704/208 |

* cited by examiner

1A
SIGNAL PROCESSING APPARATUS
100A
INPUT AUDIO-SIGNAL FOR ANALYSIS
FEATURE DETECTION UNIT
200
INPUT AUDIO-SIGNAL FOR SOUND-QUALITY CORRECTION
SOUND-QUALITY ADJUSTMENT UNIT
OUTPUT SIGNAL

SIGNAL PROCESSING APPARATUS, SIGNAL PROCESSING METHOD, AND PROGRAM FOR ADDING LONG OR SHORT REVERBERATION TO AN INPUT AUDIO BASED ON AUDIO TONE BEING MODERATE OR ORDINARY

CROSS REFERENCE TO RELATED APPLICATIONS

This application claims the benefit of Japanese Priority Patent Application JP 2013-239187 filed Nov. 19, 2013 the entire contents of which are incorporated herein by reference.

BACKGROUND

The present disclosure relates to a signal processing apparatus, a signal processing method, and a program.

Signal processing technologies for audio signals have been disclosed in these days. For example, a technology has been disclosed by which an audio signal is analyzed to calculate an speech score indicating a similarity to speech signal characteristics and a music score indicating a similarity to music signal characteristics, and by which the sound quality is adjusted based on the audio and music scores (see JP 2011-150143A, for example).

SUMMARY

However, it is desirable to provide technology capable of providing a listener with such higher presence that the listener feels like directly listening to audio emitted in a live music venue.

According to an embodiment of the present disclosure, there is provided a signal processing apparatus including a feature detection unit configured to detect, from an input signal, a detection signal including at least one of audience-generated-sound likelihood and music likelihood, and a vicinity-sound generation unit configured to generate vicinity sound based on the detection signal.

According to another embodiment of the present disclosure, there is provided a signal processing method including detecting, from an input signal, a detection signal including at least one of audience-generated-sound likelihood and music likelihood, and causing a processor to generate vicinity sound based on the detection signal.

According to another embodiment of the present disclosure, there is provided a program for causing a computer to function as a signal processing apparatus including a feature detection unit configured to detect, from an input signal, a detection signal including at least one of audience-generated-sound likelihood and music likelihood, and a vicinity-sound generation unit configured to generate vicinity sound based on the detection signal.

According to the embodiments of the present disclosure described above, it is possible to provide a listener with such higher presence that the listener feels like directly listening to audio emitted in a live music venue. Note that the aforementioned advantageous effects are not necessarily limited, and any of advantageous effects described in the specification or other advantageous effects known from the specification may be exerted in addition to or instead of the advantageous effects described above.

DETAILED DESCRIPTION OF THE EMBODIMENTS

Figure 1:
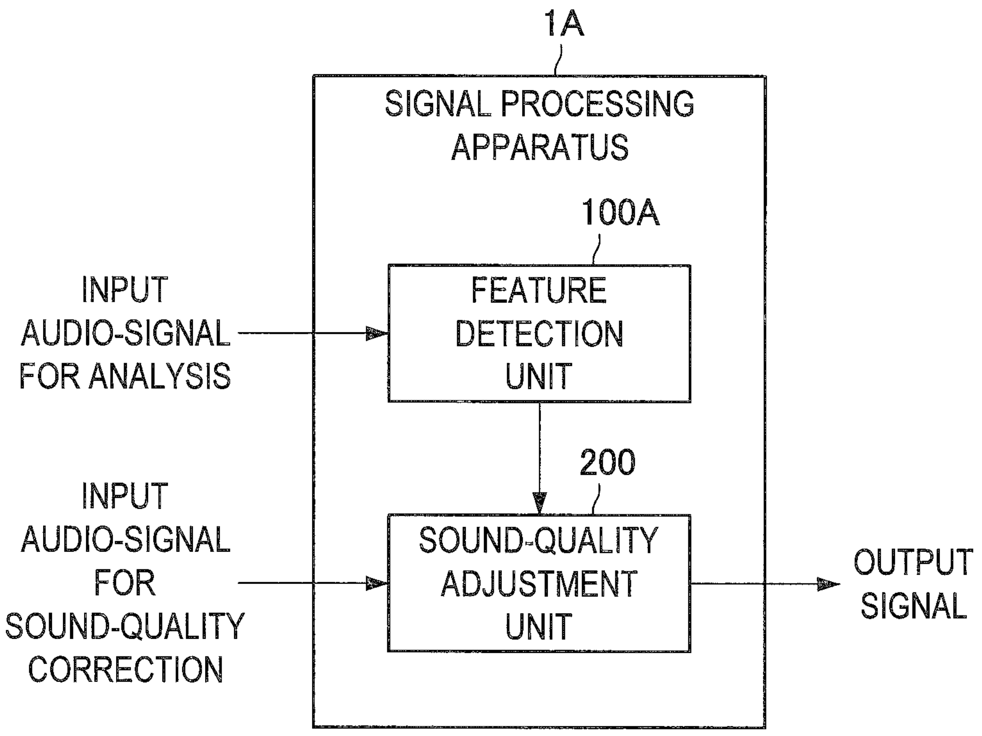
FIG. 1 is a diagram illustrating a functional configuration example of a signal processing apparatus according to a first embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

In addition, in this specification and the appended drawings, a plurality of structural elements that have substantially the same function and structure might be denoted with the same reference numerals suffixed with different letters or numbers to be discriminated from each other. However, when not having to be particularly discriminated from each other, the plurality of structural elements that have substantially the same function and structure are denoted with the same reference numerals only.

Note that description will be provided in the following order.

1. First Embodiment
2. Second Embodiment
3. Third Embodiment
4. Fourth Embodiment
5. Combination of Embodiments
6. Hardware Configuration Example of Signal Processing Apparatus
7. Conclusion

1. First Embodiment

As to be described below, a signal processing apparatus 1 is supplied with an input signal. The input signal can include an audio input signal detected in a live music venue. A person (such as a vocal) who utters a voice (hereinafter, also referred to as "center sound") to the audience is present in the live music venue. Meanwhile, sounds uttered by the audience in the live music venue are hereinafter collectively referred to as audience-generated sound. The audience-generated sound may include voices uttered by the audience, applause sounds, whistle sounds, and the like. Firstly, a first embodiment of the present disclosure will be described.

FIG. 1 is a diagram illustrating a functional configuration example of a signal processing apparatus 1A according to the first embodiment of the present disclosure. As illustrated in FIG. 1, the signal processing apparatus 1A according to the first embodiment of the present disclosure includes a feature detection unit 100A and a sound-quality adjustment unit 200. The feature detection unit 100A detects at least one of audience-generated-sound likelihood, music likelihood, and a tone, from an input audio-signal for analysis, and supplies the sound-quality adjustment unit 200 with a detection signal obtained by the detection.

The sound-quality adjustment unit 200 adaptively adjusts the sound quality based on the detection signal supplied from the feature detection unit 100A. FIG. 1 shows an example in which the feature detection unit 100A and the sound-quality adjustment unit 200 are supplied with the input audio-signal for analysis and an input audio-signal for sound-quality correction, respectively. However, the same signal may be supplied as the input audio-signal for analysis to be supplied to the feature detection unit 100A and the input audio-signal for sound-quality correction supplied to the sound-quality adjustment unit 200.

Figure 2:
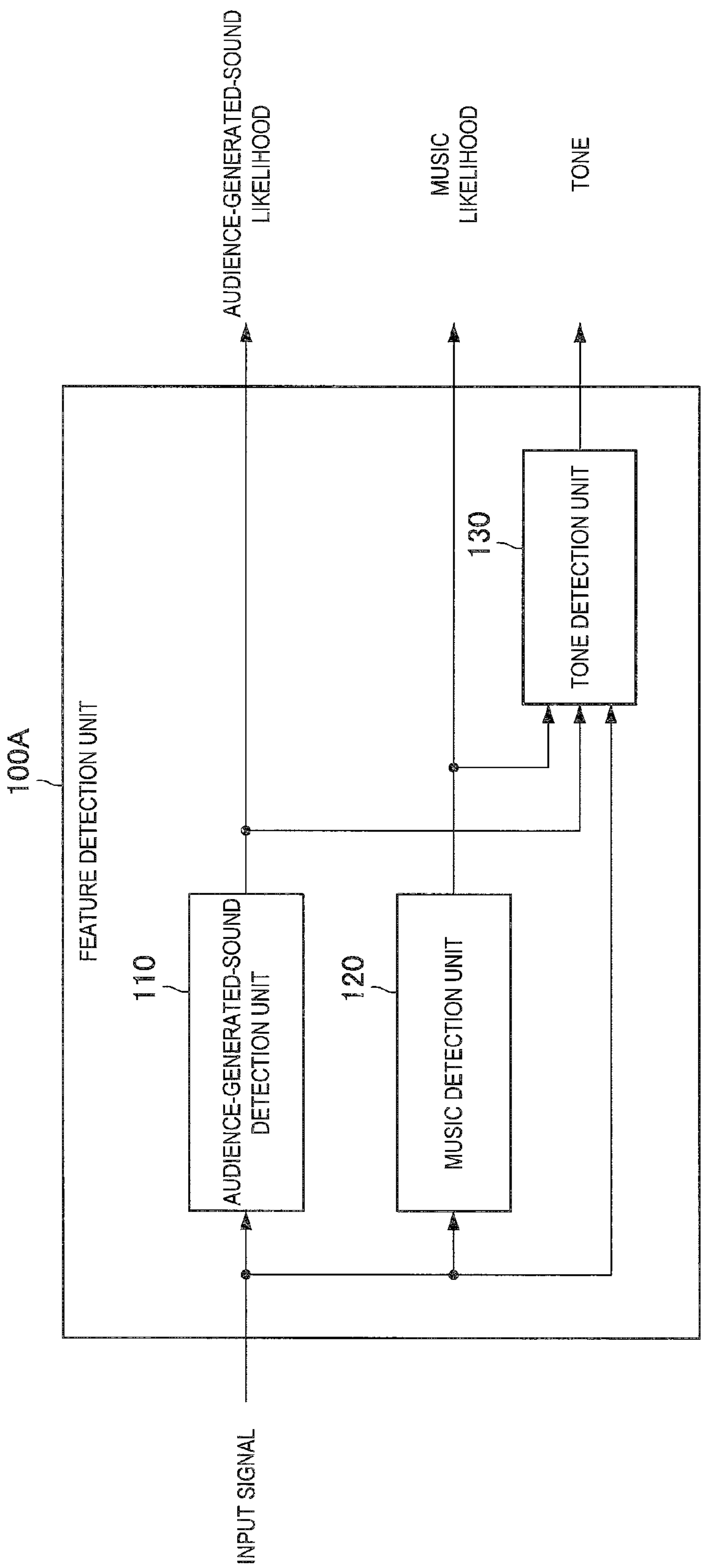
FIG. 2 is a diagram illustrating a detailed configuration example of a feature detection unit according to the embodiment.

Subsequently, description is given of a detailed configuration example of the feature detection unit 100A according to the first embodiment of the present disclosure. FIG. 2 is a diagram illustrating the detailed configuration example of the feature detection unit 100A according to the first embodiment of the present disclosure. The feature detection unit 100A may include at least one of an audience-generated-sound detection unit 110, a music detection unit 120, and a tone detection unit 130.

The audience-generated-sound detection unit 110 detects audience-generated-sound likelihood indicating how much an input signal includes audience-generated sound, and outputs the detected audience-generated-sound likelihood. The music detection unit 120 also detects music likelihood indicating how much the input signal includes music, and outputs the detected music likelihood. The tone detection unit 130 further detects a tone of music in the input signal, and outputs the detected tone.

Note that when the feature detection unit 100A includes both the music detection unit 120 and the tone detection unit 130, the tone detection unit 130 may detect the tone only in the case where the music detection unit 120 judges the likelihood as music likelihood.

Figure 3:
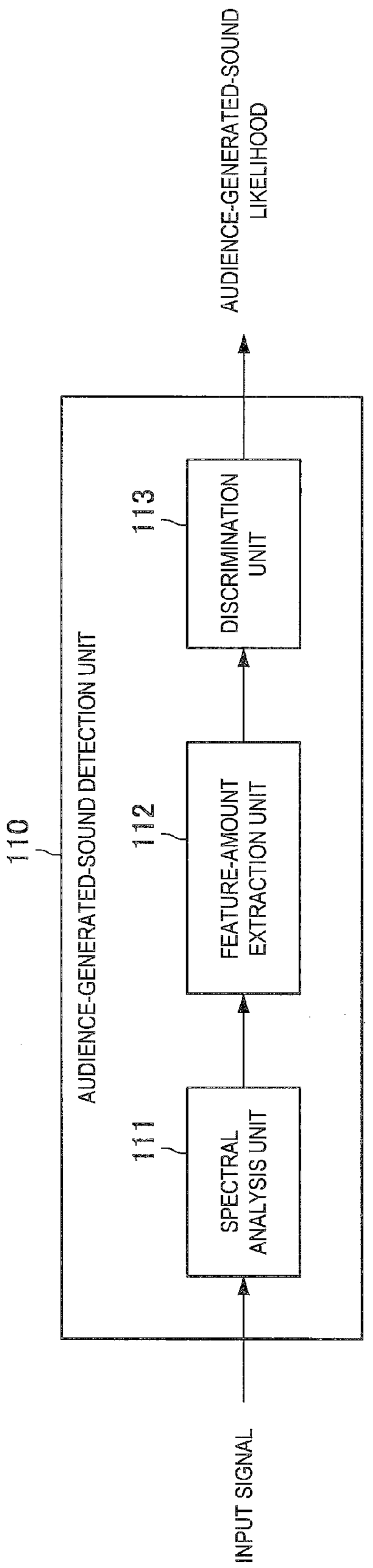
FIG. 3 is a diagram illustrating a detailed configuration example of an audience-generated-sound detection unit according to the embodiment.

Subsequently, description is given of a detailed configuration example of the audience-generated-sound detection unit 110 according to the first embodiment of the present disclosure. FIG. 3 is a diagram illustrating the detailed configuration example of the audience-generated-sound detection unit 110 according to the first embodiment of the present disclosure. As illustrated in FIG. 3, the audience-generated-sound detection unit 110 may include a spectral analysis unit 111, a feature-amount extraction unit 112, and a discrimination unit 113.

The spectral analysis unit 111 performs a spectral analysis on an input signal and supplies the feature-amount extraction unit 112 with a spectrum obtained as the analysis result. A method for the spectral analysis is not particularly limited, and may be based on a time domain or a frequency domain. The feature-amount extraction unit 112 extracts a feature amount (such as a spectral shape or the degree of a spectral peak) based on the spectrum supplied from the spectral analysis unit 111, and supplies the discrimination unit 113 with the extracted feature amount.

Figure 4:
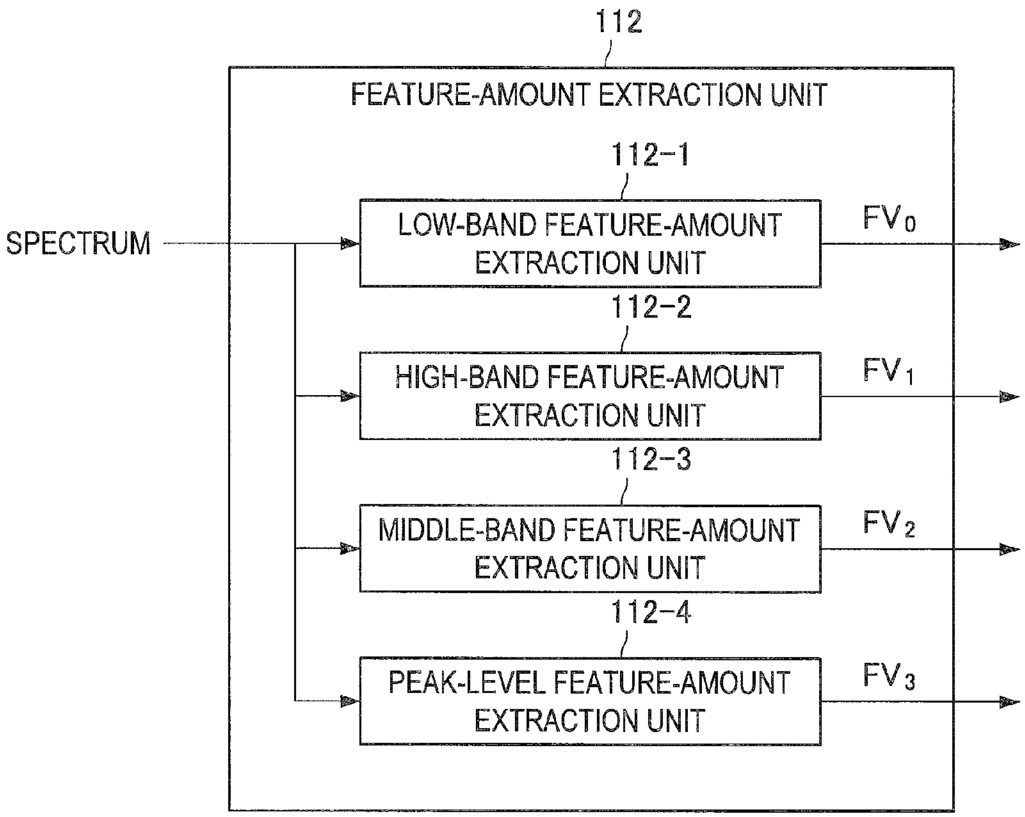
FIG. 4 is a diagram illustrating a detailed configuration example of a feature-amount extraction unit according to the embodiment.

Subsequently, description is further given of a detailed configuration example of the feature-amount extraction unit 112 according to the first embodiment of the present disclosure. FIG. 4 is a diagram illustrating the detailed configuration example of the feature-amount extraction unit 112 according to the first embodiment of the present disclosure. As illustrated in FIG. 4, the feature-amount extraction unit 112 according to the first embodiment of the present disclosure may include a low-band feature-amount extraction unit 112-1, a high-band feature-amount extraction unit 112-2, a middle-band feature-amount extraction unit 112-3, and a peak-level feature-amount extraction unit 112-4.

Note that a scene in which music is played is hereinafter simply referred to as a "music scene". Also, a scene in which audience-generated sound is uttered between one music scene and another music scene is simply referred to as a "cheer scene".

Firstly, a low-band level of the spectrum supplied from the spectral analysis unit 111 is $LV_0$. The low-band feature-amount extraction unit 112-1 can calculate a low-band feature amount $FV_0$ as an example of the spectral shape in accordance with the following Formula (1).

$$FV_0=w_0(LV_0-th_0) \tag{1}$$

Here, $th_0$ may be a threshold defined by preliminary learning. Specifically, the learning may be performed in such a manner that $LV_0$ exceeds $th_0$ in a non-cheer scene such as a music scene and does not exceed $th_0$ in a cheer scene.

Likewise, a high-band level of the spectrum supplied from the spectral analysis unit 111 is $LV_1$. The high-band feature-amount extraction unit 112-2 can calculate a high-band feature amount $FV_1$ as an example of the spectral shape in accordance with the following Formula (2).

$$FV_1=w_1(LV_1-th_1) \tag{2}$$

Likewise, a middle-band level of the spectrum supplied from the spectral analysis unit 111 is $LV_2$. The middle-band feature-amount extraction unit 112-3 can calculate a middle-band feature amount $FV_2$ as an example of the spectral shape in accordance with the following Formula (3).

$$FV_2=w_2(LV_2-th_2) \tag{3}$$

Here, $th_2$ may be a threshold defined by preliminary learning. Specifically, the learning may be performed in such a manner that $LV_2$ exceeds $th_2$ in a cheer scene and does not exceed $th_2$ in a non-cheer scene such as a music scene.

Figure 5:
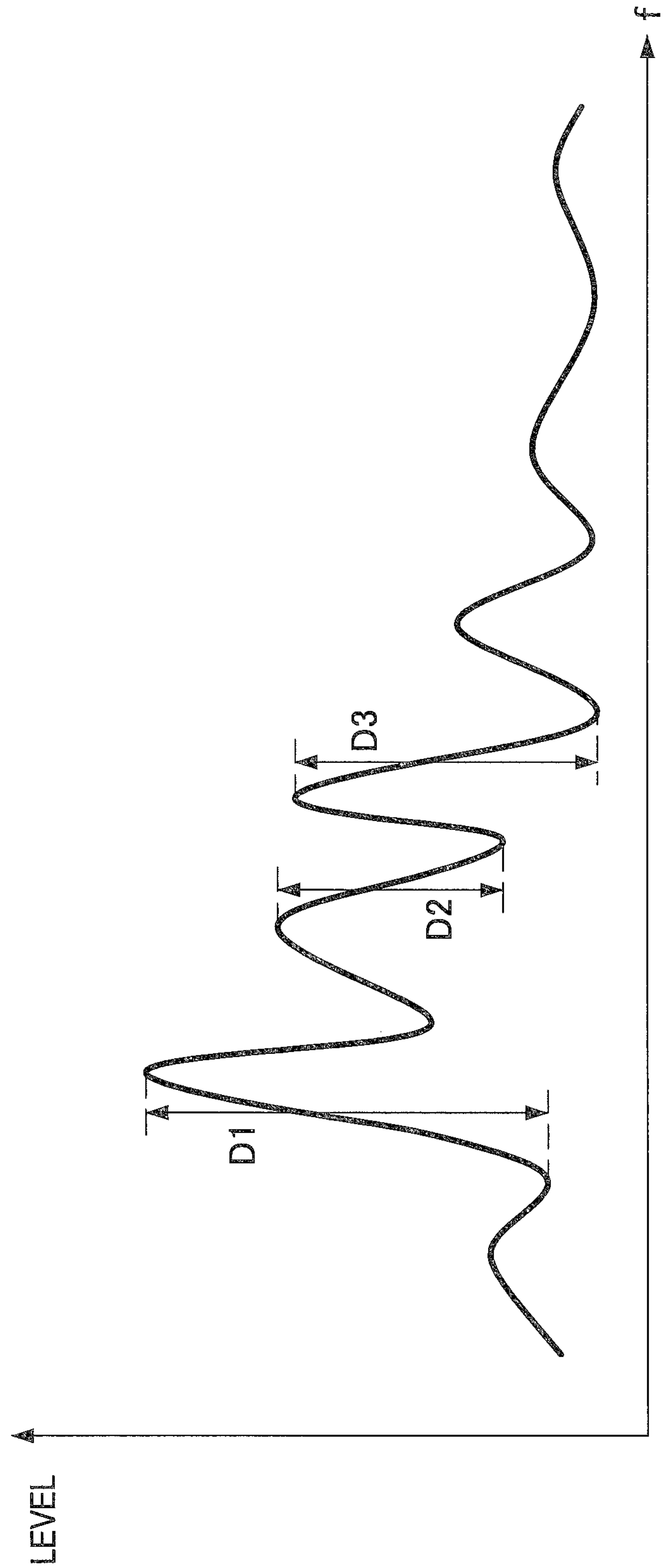
FIG. 5 is a diagram for explaining a function of a peak-level feature-amount calculation unit according to the embodiment.

The peak-level feature-amount extraction unit 112-4 may also calculate a peak-level feature-amount $FV_3$ as an example of the degree of spectral peaks, by using the sum of spectral peak levels (differences each between a maximum-value level and a minimum-value level adjacent to the maximum-value level). For example, when the spectral analysis unit 111 supplies a spectrum as illustrated in FIG. 5, the peak-level feature-amount extraction unit 112-4 can calculate the peak-level feature-amount $FV_3$ by using a sum $LV_3$ of spectral peak levels (shown by, for example, D1, D2, and D3) in accordance with Formula (4).

$$FV_3=w_3(LV_3-th_3) \tag{4}$$

Here, $th_3$ may be a threshold defined by preliminary learning. Specifically, the learning may be performed in such a manner that $LV_3$ exceeds $th_3$ in a non-cheer scene such as a music scene and does not exceed $th_3$ in a cheer scene.

Note that $w_0$, $w_1$, $w_2$, and $w_3$ are weighting factors depending on reliability of the feature amounts, respectively, and may be learned so that the discrimination unit 113 has the most appropriate result. For example, a plus or minus sign of each of $w_0$ to $w_3$ may be determined in the following manner. Specifically, when audience-generated-sound likelihood Chrlh to be described later takes on a positive value, the discrimination unit 113 judges the likelihood as audience-generated-sound likelihood. When the audience-generated-sound likelihood Chrlh takes on a negative value, the discrimination unit 113 judges the likelihood as not audience-generated-sound likelihood.

The discrimination unit 113 discriminates the audience-generated-sound likelihood based on the feature amount supplied from the feature-amount extraction unit 112. For example, the discrimination unit 113 discriminates the audience-generated-sound likelihood by using the following conditions based on the spectral shape. The conditions are: the low-band level is lower than a threshold; the high-band level is lower than a threshold; and the middle-band level (a voice-band level) is high. If at least one of the conditions is satisfied, it can be judged that musical instrument sound of low-tone musical instruments (such as a bass and a bass drum) and many high-tone musical instruments such as cymbals is fainter than other sounds and that sound in the middle-band level is louder. Accordingly, the discrimination unit 113 may judge the likelihood as audience-generated-sound likelihood in this case.

Meanwhile, audience-generated sound is considered to have lower spectral peak density than music. Hence, when the spectral peak density is lower than a threshold, the discrimination unit 113 may judge the likelihood as audience-generated-sound likelihood. For example, the discrimination unit 113 can calculate the audience-generated-sound likelihood Chrlh by using the feature amounts $FV_0$ to $FV_3$ in accordance with the following Formula (5).

$$Chrlh=\sum_{i=0}^{3} FV_i \tag{5}$$

For example, when the audience-generated-sound likelihood Chrlh takes on a positive value, the discrimination unit 113 may judge the likelihood as audience-generated-sound likelihood. In contrast, when the audience-generated-sound likelihood Chrlh takes on a negative value, the discrimination unit 113 may judge the likelihood as not audience-generated-sound likelihood.

Figure 6:
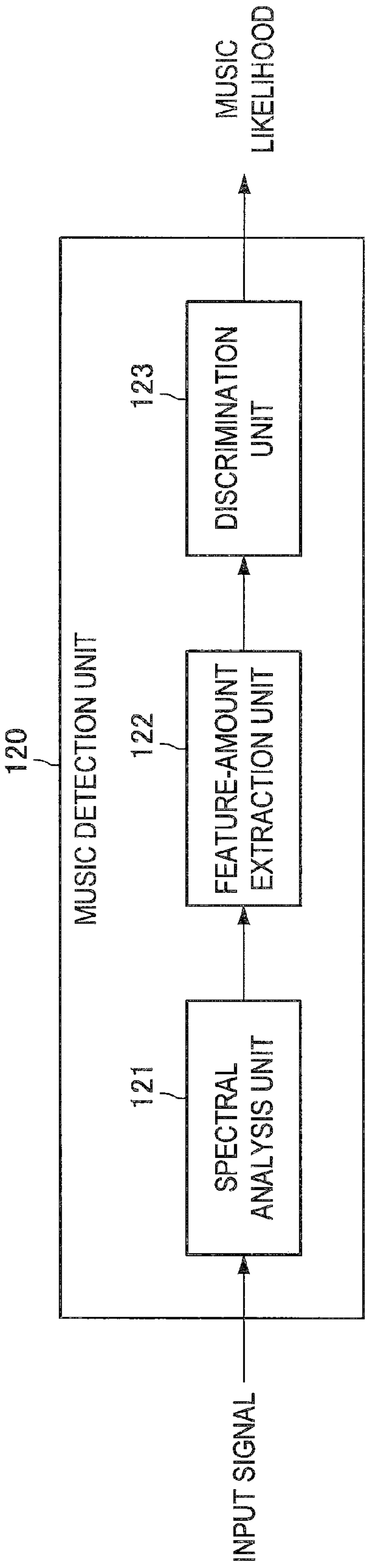
FIG. 6 is a diagram illustrating a detailed configuration example of a music detection unit according to the embodiment.

Subsequently, description is given of a detailed configuration example of the music detection unit 120 according to the first embodiment of the present disclosure. FIG. 6 is a diagram illustrating the detailed configuration example of the music detection unit 120 according to the first embodiment of the present disclosure. As illustrated in FIG. 6, the music detection unit 120 may include a spectral analysis unit 121, a feature-amount extraction unit 122, and a discrimination unit 123.

The spectral analysis unit 121 performs a spectral analysis on the input signal and supplies the feature-amount extraction unit 122 with a spectrum obtained as the analysis result. A method for the spectral analysis is not particularly limited, and may be based on a time domain or a frequency domain. The feature-amount extraction unit 122 extracts a feature amount (such as a spectral shape, the degree of a spectral peak, the density of large time variations of the low-band level, or the density of zero crosses of a ramp of the low-band level) based on the spectrum supplied from the spectral analysis unit 121, and supplies the discrimination unit 123 with the extracted feature amount.

Figure 7:
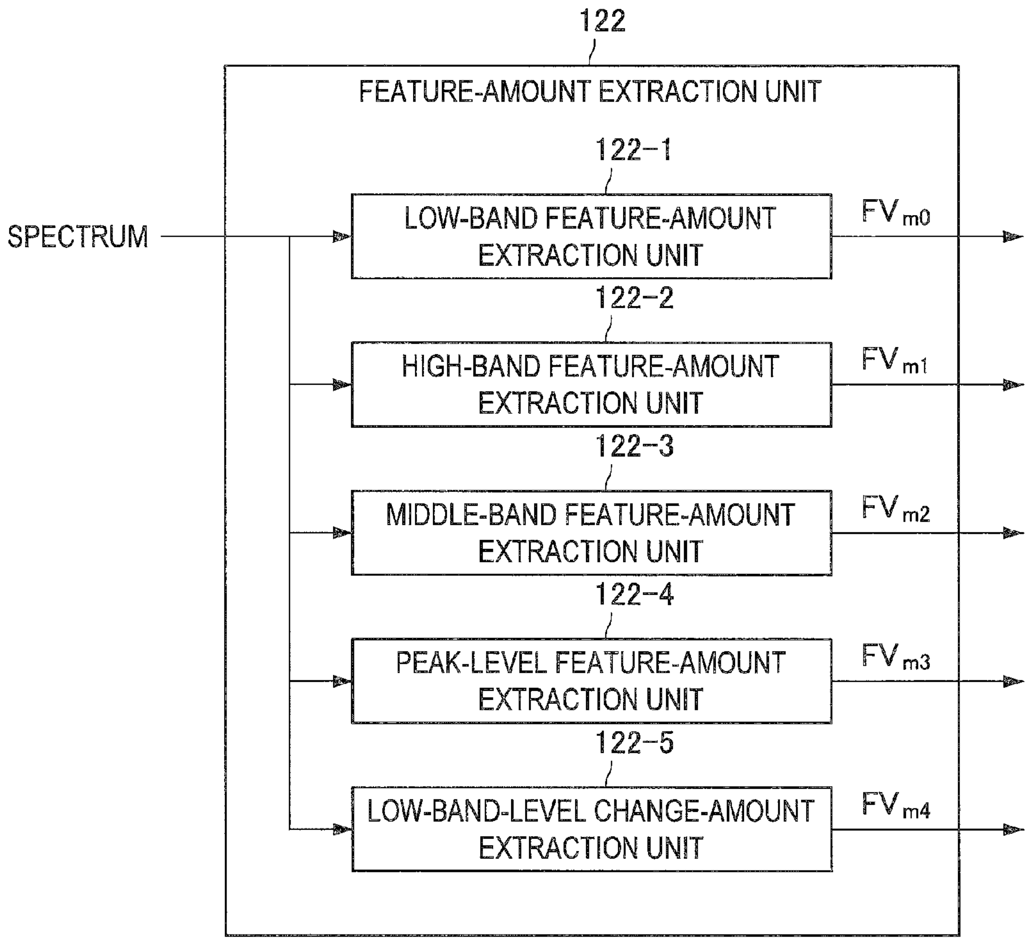
FIG. 7 is a diagram illustrating a detailed configuration example of a feature-amount extraction unit according to the embodiment.

Subsequently, description is further given of a detailed configuration example of the feature-amount extraction unit 122 according to the first embodiment of the present disclosure. FIG. 7 is a diagram illustrating the detailed configuration example of the feature-amount extraction unit 122 according to the first embodiment of the present disclosure. As illustrated in FIG. 7, the feature-amount extraction unit 122 according to the first embodiment of the present disclosure may include a low-band feature-amount extraction unit 122-1, a high-band feature-amount extraction unit 122-

2, a middle-band feature-amount extraction unit 122-3, a peak-level feature-amount extraction unit 122-4, and a low-band-level change-amount extraction unit 122-5.

Firstly, a low-band level of the spectrum supplied from the spectral analysis unit 121 is $LV_0$. The low-band feature-amount extraction unit 122-1 can calculate a low-band feature amount $FV_{m0}$ as an example of the spectral shape in accordance with the following Formula (6).

$$FV_{m0}=w_{m0}(LV_0-th_{m0}) \quad (6)$$

Here, $th_{m0}$ may be a threshold defined by preliminary learning. Specifically, the learning may be performed in such a manner that $LV_0$ exceeds $th_{m0}$ in a music scene and does not exceed $th_{m0}$ in a non-music scene such as a cheer scene.

Likewise, a high-band level of the spectrum supplied from the spectral analysis unit 121 is $LV_1$. The high-band feature-amount extraction unit 122-2 can calculate a high-band feature amount $FV_{m1}$ as an example of the spectral shape in accordance with the following Formula (7).

$$FV_{m1}=w_{m1}(LV_1-th_{m1}) \quad (7)$$

Likewise, a middle-band level of the spectrum supplied from the spectral analysis unit 121 is $LV_2$. The middle-band feature-amount extraction unit 122-3 can calculate a middle-band feature amount $FV_{m2}$ as an example of the spectral shape in accordance with the following Formula (8).

$$FV_{m2}=w_{m2}(LV_2-th_{m2}) \quad (8)$$

Here, $th_{m2}$ may be a threshold defined by preliminary learning. Specifically, the learning may be performed in such a manner that $LV_2$ exceeds $th_{m2}$ in a music scene and does not exceed $th_{m2}$ in a non-music scene such as a cheer scene.

In addition, the peak-level feature-amount extraction unit 122-4 may calculate the peak-level feature-amount $FV_3$ as an example of the degree of spectral peaks, by using the sum of spectral peak levels (differences each between a maximum-value level and a minimum-value level adjacent to the maximum-value level). For example, when the spectral analysis unit 121 supplies a spectrum as illustrated in FIG. 5, the peak-level feature-amount extraction unit 122-4 can calculate a peak-level feature-amount $FV_{m3}$ by using the sum $LV_3$ of spectral peak levels (shown by, for example, D1 to D3) in accordance with Formula (9).

$$FV_{m3}=w_{m3}(LV_3-th_{m3}) \quad (9)$$

Here, $th_{m3}$ may be a threshold defined by preliminary learning. Specifically, the learning may be performed in such a manner that $LV_3$ exceeds $th_{m3}$ in a non-music scene such as a cheer scene and does not exceed $th_{m3}$ in a music scene.

In addition, the low-band-level change-amount extraction unit 122-5 can calculate the density of large time variations of the low-band level in the following manner. Firstly, a low-band level at time t is $LV_0(t)$, and a low-band level at time t−Δt is $LV_0(t-\Delta t)$. The low-band-level change-amount extraction unit 122-5 can calculate a flag fig in accordance with the following Formulae (10) and (11).

$$\text{when } LV_0(t)\times LV_0(t-\Delta t)>th, flg(t)=1 \quad (10)$$

$$\text{others}, flg(t)=0 \quad (11)$$

However, th is a threshold, and may be set so that $LV_0(t)-LV_0(t-\Delta t)$ can exceed th, for example, when an input signal includes sound of beating a bass drum. The low-band-level change-amount extraction unit 122-5 can calculate a time average f# of flg(t) as an example of the density of large time variations of the low-band level in accordance with the following Formula (12).

$$f\# = \frac{\sum_t flg(t)}{T} \quad (12)$$

Here, reference numeral T denotes an average time. The low-band-level change-amount extraction unit 122-5 can calculate a low-band-level variation amount $FV_{m4}$ by using the time average f# of flg(t) in accordance with the following Formula (13).

$$FV_{m4}=w_{m4}(f\#-th_{m4}) \quad (13)$$

Note that $w_{m0}$, $w_{m2}$, $w_{m3}$, and $w_{m4}$ are weighting factors depending on reliability of the feature amounts, respectively, and learning may be performed in such a manner that the discrimination unit 123 has the most appropriate result. For example, a plus or minus sign of each of $w_{m0}$ to $w_{m4}$ may be determined in the following manner. Specifically, when music likelihood Msclh to be described later takes on a positive value, the discrimination unit 123 judges the likelihood as music likelihood. When the music likelihood Msclh takes on a negative value, the discrimination unit 123 judges the likelihood as not music likelihood.

The discrimination unit 123 discriminates the music likelihood based on the feature amount supplied from the feature-amount extraction unit 122. For example, the discrimination unit 123 judges the music likelihood by using the following conditions based on the spectral shape. The conditions are: the low-band level is higher than the threshold; the high-band level is higher than the threshold; and the middle-band level (voice-band level) is low. If at least one of the conditions is satisfied, it can be judged that musical instrument sound of the low-tone musical instruments (such as the bass and the bass drum) and many high-tone musical instruments such as the cymbals is louder than other sounds and that sound in the middle-band level is fainter. Accordingly, the discrimination unit 123 may judge the likelihood as music likelihood in this case.

In addition, music is considered to have higher spectral peak density than audience-generated sound. Hence, when the spectral peak density is higher than the threshold, the discrimination unit 123 may judge the likelihood as music likelihood.

Meanwhile, when the input signal includes sound of beating the bass drum, the low-band level changes sharply and largely. Accordingly, when a low-band-level change amount per unit time is larger than a threshold, the discrimination unit 123 can judge that the input signal is highly likely to include sound of beating the bass drum. For this reason, when how frequently the low-band-level change amount per unit time exceeds the threshold exceeds an upper limit value, the discrimination unit 123 can judge that music including the sound of the bass drum is continuously played, and thus may judge the likelihood as music likelihood.

For example, the discrimination unit 123 can calculate the music likelihood Msclh by using the feature amounts $FV_{m0}$ to $FV_{m4}$ in accordance with the following Formula (14).

$$Msclh = \sum_{mi=0}^{4} FV_{mi} \quad (14)$$

For example, when the music likelihood Msclh takes on a positive value, the discrimination unit 123 may judge the likelihood as music likelihood. In contrast, when the music likelihood Msclh takes on a negative value, the discrimination unit 123 may judge the likelihood as not music likelihood. Note that a music scene generally lasts for a relatively long time, the discrimination unit 123 may use a time average of the music likelihood Msclh for the discrimination.

Figure 9:
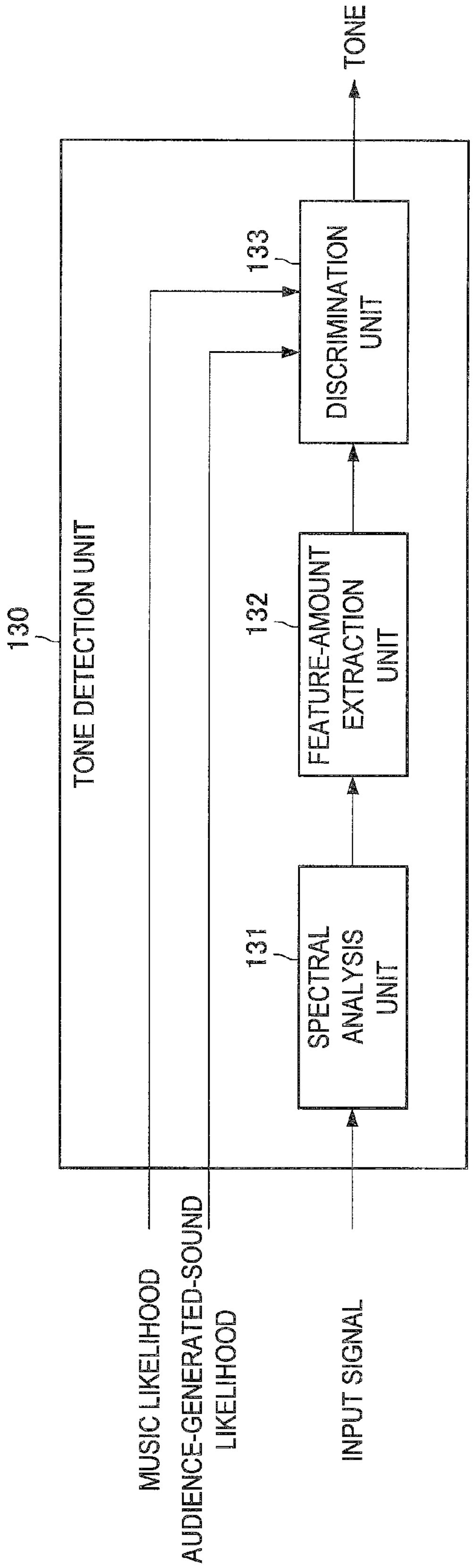
FIG. 9 is a diagram illustrating a detailed configuration example of a tone detection unit according to the embodiment.

Subsequently, description is further given of a detailed configuration example of the tone detection unit 130 according to the first embodiment of the present disclosure. FIG. 9 is a diagram illustrating the detailed configuration example of the tone detection unit 130 according to the first embodiment of the present disclosure. As illustrated in FIG. 9, the tone detection unit 130 according to the first embodiment of the present disclosure may include a spectral analysis unit 131, a feature-amount extraction unit 132, and a discrimination unit 133.

The spectral analysis unit 131 performs a spectral analysis on the input signal, and supplies the feature-amount extraction unit 132 with a spectrum obtained as the analysis result. A method for the spectral analysis is not particularly limited, and may be based on a time domain or a frequency domain. The feature-amount extraction unit 132 extracts a feature amount (such as a long-time average of the low-band level or the density of zero crosses of a ramp of the low-band level) based on the spectrum supplied from the spectral analysis unit 131, and supplies the discrimination unit 133 with the extracted feature amount.

The discrimination unit 133 discriminates a tone based on the feature amount. Examples of a tone include a moderate tone (a tone such as a ballad or reciting to the singer's own accompaniment) including almost no sound of the low-tone musical instrument such as the bass or the bass drum, a tone having distorted bass sound, other ordinary tones (such as rock and pop), a not music-like tone, and the like. For example, the moderate tone generally has a low low-band level. However, it is assumed that an ordinary tone also might have a low low-band level because sound of the low-tone musical instrument is temporarily missing. Thus, an average of a long time may be used for the low-band level.

Hence, when the long-time average of the low-band level falls below a threshold, the discrimination unit 133 may judge the tone as a moderate tone. In contrast, when the long-time average of the low-band level exceeds the threshold, the discrimination unit 133 may judge the tone as an aggressive tone. At this time, for example, when a tone quickly switches between the moderate tone and the aggressive tone, simply using the long-time average of the low-band level might cause delay in following change of the tone.

Hence, when the audience-generated-sound likelihood exceeds the threshold, the discrimination unit 133 can also reduce time for averaging the low-band level to quickly follow change of the tone. As described above, the time for averaging the low-band level is not particularly limited.

Figure 8:
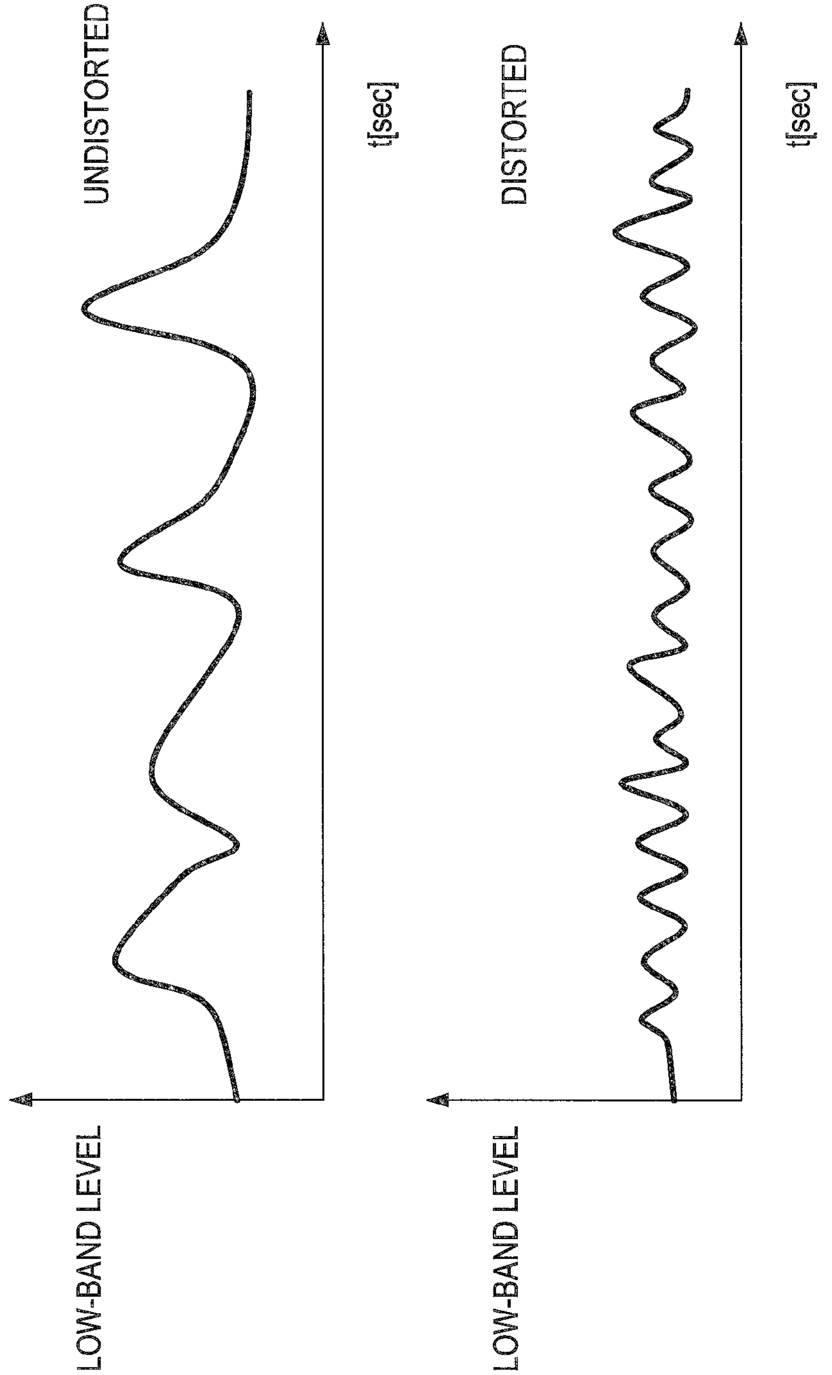
FIG. 8 is a diagram for explaining a function of a low-band-level change-amount extraction unit according to the embodiment.

Meanwhile, as illustrated in FIG. 8, even in the case of the same low-band level, the density of zero crosses of a ramp of the low-band level is considered to differ depending on whether or not sound is distorted. A sound source having clear grain-like peaks of bass drum sound (undistorted bass sound) or the like exhibits relatively large peaks in time change of the low-band level, and thus zero crosses of a ramp of the low-band level are considered to have low density. In contrast, distortion of the bass sound or the like causes the low-band level to change relatively frequently, and thus zero crosses of a ramp of the low-band level are considered to have high density.

Hence, when the density of zero crosses of a ramp of the low-band level exceeds a threshold, the discrimination unit 133 may discriminate a tone having undistorted bass sound. In contrast, when the density of zero crosses of a ramp of the low-band level falls below the threshold, the discrimination unit 133 may discriminate a tone having distorted bass sound.

Figure 10:
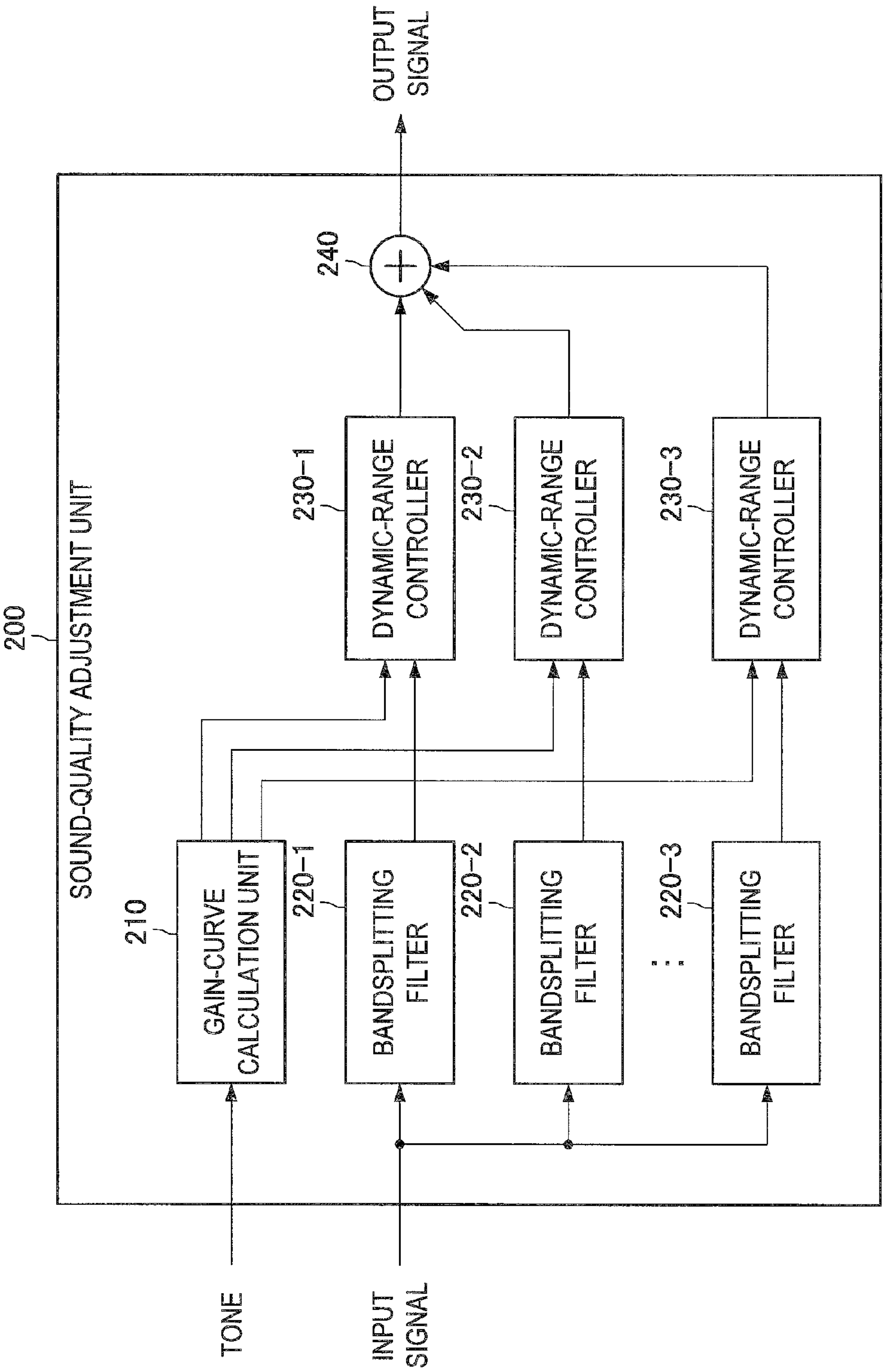
FIG. 10 is a diagram illustrating a detailed function example of a sound-quality adjustment unit according to the embodiment.

Subsequently, description is given of a detailed configuration example of the sound-quality adjustment unit 200 according to the first embodiment of the present disclosure. FIG. 10 is a diagram illustrating a detailed function example of the sound-quality adjustment unit 200 according to the first embodiment of the present disclosure. As illustrated in FIG. 10, the sound-quality adjustment unit 200 may include a gain-curve calculation unit 210, bandsplitting filters 220-1, 220-2, and 220-3, dynamic-range controllers 230-1, 230-2, and 230-3, and an adder 240.

Note that in the example in FIG. 10, the sound-quality adjustment unit 200 includes the three bandsplitting filters 220 and the three dynamic-range controllers 230. The bandsplitting filters 220 are provided for the low band, the middle band, and the high band, respectively. The same holds true for the dynamic-range controllers 230. However, the number of the bandsplitting filters 220 and the dynamic-range controllers 230 is not particularly limited.

The sound-quality adjustment unit 200 may adjust the sound quality based on a detection signal at least by controlling a dynamic range. More specifically, each bandsplitting filter 220 divides the input signal to have a signal in the corresponding band. The gain-curve calculation unit 210 calculates change (a gain curve) of a coefficient by which each band level is multiplied based on a tone. Each dynamic-range controller 230 adjusts the sound quality by multiplying the band level divided by the bandsplitting filter 220 by the coefficient. The adder 240 adds up signals from the dynamic-range controllers 230 and outputs a resultant signal.

Each dynamic-range controller 230 can operate as a compressor for generating input signals having such a high (a narrow dynamic range) sound-volume impression that is experienced in a live music venue. The dynamic-range controller 230 may be a multiband compressor or a single-band compressor. When being a multiband compressor, the dynamic-range controller 230 can also boost the low-band and high-band levels to thereby generate signals having such frequency characteristics that are exhibited in music heard in the live music venue.

Meanwhile, in a live music venue, the compressor is often set low for a moderate tone to produce a free and easy sound. Accordingly, when the tone detection unit 130 discriminates a moderate tone, the gain-curve calculation unit 210 can reproduce the sound produced in the live music venue by calculating such a gain curve that causes lower setting of the compressor.

In addition, when the tone detection unit 130 discriminates a tone having a largely distorted low-band level, the gain-curve calculation unit 210 can prevent generation of an unpleasant sound with emphasized distortion, by calculating such a gain curve that causes lower setting of the compressor. Moreover, the audience-generated sound does not pass through a public address (PA), and thus does not have to be subjected to the compressor processing. Thus, when the audience-generated-sound detection unit 110 judges the likelihood as not audience-generated-sound likelihood, the gain-curve calculation unit 210 can prevent change of the sound quality of the audience-generated sound by calculating such a gain curve that causes lower setting of the compressor.

Figure 11:
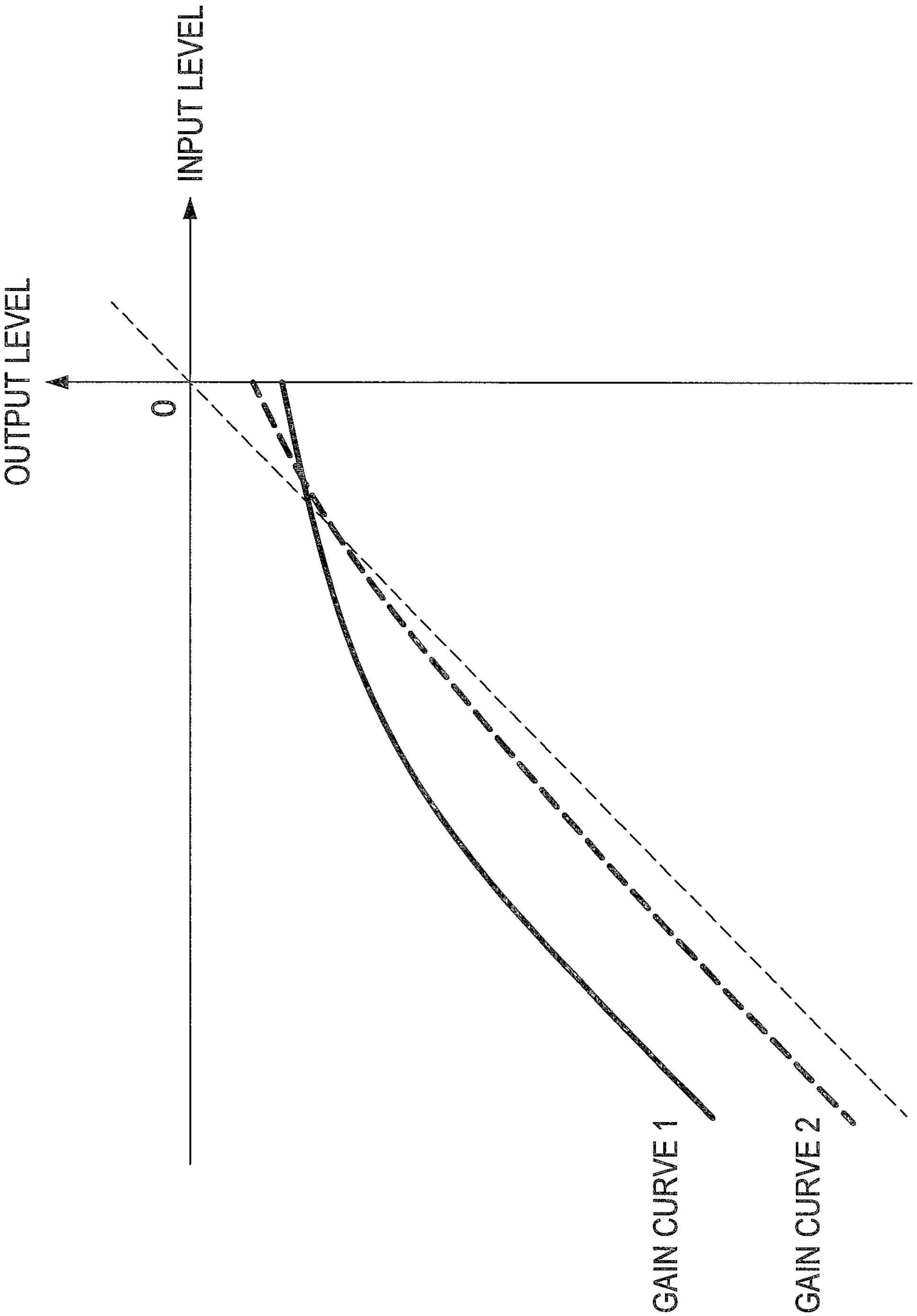
FIG. 11 is a diagram for explaining a function of a gain-curve calculation unit according to the embodiment.

FIG. 11 is a diagram illustrating an example of the gain curve calculated by the gain-curve calculation unit 210. For example, when the tone detection unit 130 discriminates an ordinary tone (rock in middle or quick tempo or pop), the gain-curve calculation unit 210 may calculate such a gain curve as a gain curve 1 to enhance the sound-volume impression. With reference to FIG. 11, the gain curve 1 is depicted as a curve showing: an input level higher than an output level when the input level falls below a threshold; and the input level lower than the output level when the input level exceeds the threshold.

However, when the bass sound is largely distorted, increasing a gain as shown by the gain curve 1 further amplifies the distortion and thus might produce unpleasant sound. For this reason, when the tone detection unit 130 judges the tone as the tone having largely distorted bass sound, control may be performed to prevent the tone from being distorted by calculating such a gain curve as a gain curve 2 and by changing a boost amount. With reference to FIG. 11, in comparison with the gain curve 1, the gain curve 2 has a reduced output level relative to the input level (such a gain curve that causes lower compressor setting than in the gain curve 1).

Figure 12:
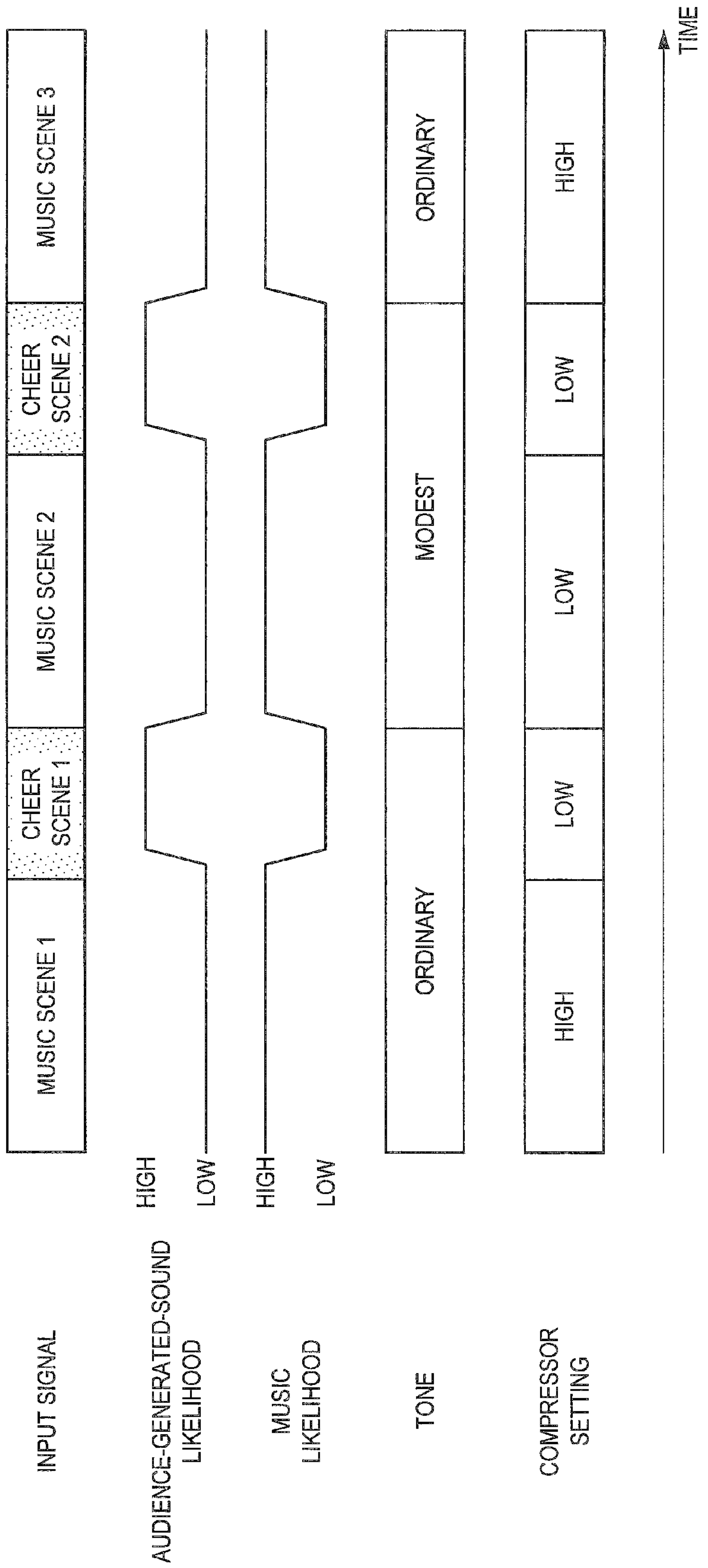
FIG. 12 is a diagram illustrating an example of the degree of compressor setting.

In contrast, when the tone detection unit 130 discriminates a moderate tone, the gain-curve calculation unit 210 may change the setting to that of the gain curve 2 and thus perform control to prevent excessive sound quality change. This is because priority might be given to a sound quality over a sound-volume impression. FIG. 12 is a diagram illustrating an example of the degree of the compressor setting. The gain-curve calculation unit 210 may calculate the gain curve so that the degree of the compressor setting can be controlled in accordance with the example in FIG. 12. Note that smooth gain curve change is preferable to avoid noise occurrence.

Figure 13:
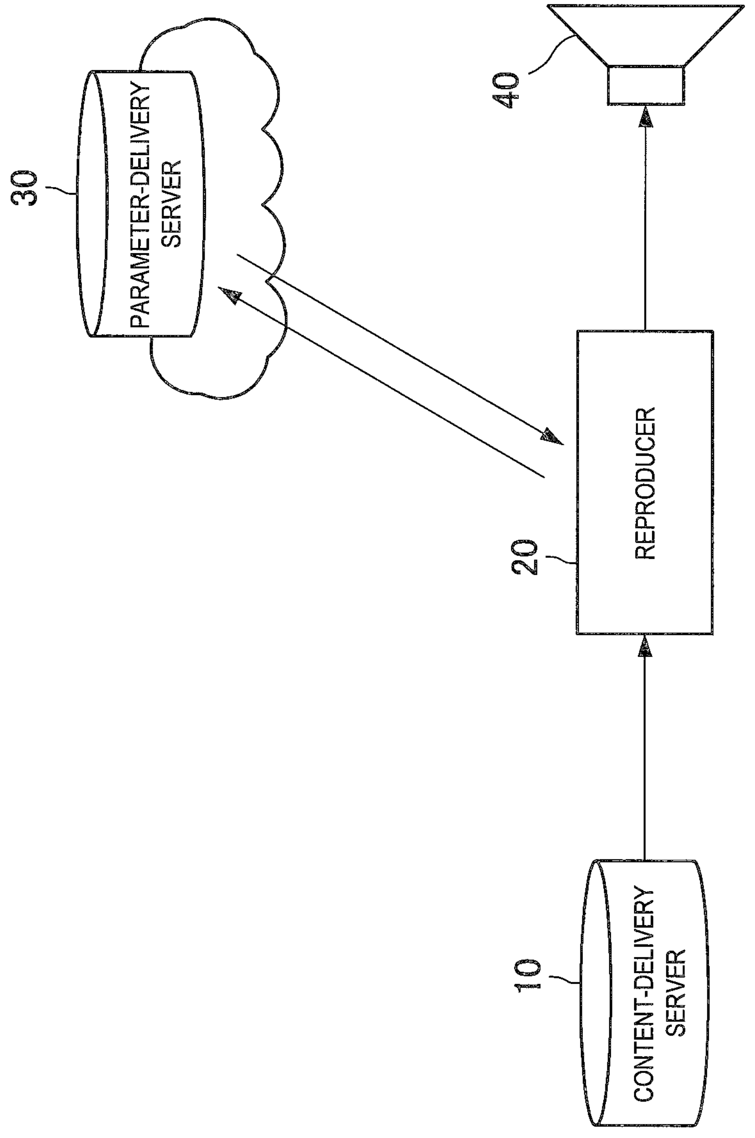
FIG. 13 is a diagram illustrating an example of a system that performs more advanced signal processing in cooperation with servers.

Further, more advanced signal processing may be performed in cooperation with servers. FIG. 13 is a diagram illustrating an example of a system that performs more advanced signal processing in cooperation with servers. The system in FIG. 13 includes a content-delivery server 10, a reproducer 20, a parameter-delivery server 30, and a speaker 40. The content-delivery server 10 is a server that provides content by using the reproducer 20, and the speaker 40 outputs the content reproduced by the reproducer 20.

For example, a case is assumed in which the feature detection unit 100A of the reproducer 20 detects tune information (such as information for identifying a tune or tune genre information) from the content. In this case, the sound-quality adjustment unit 200 may acquire sound-quality adjustment parameters for the tune information from the parameter-delivery server 30 and adjust the sound quality according to the acquired sound-quality adjustment parameters.

Another case is also assumed in which a server has functions of the feature detection unit 100A and the sound-quality adjustment unit 200. In this case, the reproducer 20 may provide the server with content, and the server may acquire the content having undergone sound-quality adjustment and reproduce the content. At this time, the reproducer 20 may transmit, to the server, performance information (such as a supporting frequency or a supporting sound pressure) of the reproducer 20 together with the content and may cause the server to adjust the sound quality so that content meeting the performance information of the reproducer 20 can be obtained.

According to the first embodiment of the present disclosure as described above, it is possible to detect a tone while adaptively changing the degree of compressor setting according to the tone. For this reason, sound of many tunes such as rock and pop can be adjusted to such sound with a large-sound-volume impression that is heard in a live music venue. In contrast, for a tune desired to be moderate, free, and easy, it is possible to automatically lower the compressor setting and thereby to prevent distortion from causing loss of the easiness. Moreover, when bass sound recorded in content is originally distorted, it is possible to prevent influence by the compressor from causing the distortion to be further increased, thereby preventing unpleasant sound generation.

2. Second Embodiment

Subsequently, description is given of a second embodiment of the present disclosure. Structural elements in the second embodiment of the present disclosure that have substantially the same function and structure as in the first embodiment of the present disclosure are denoted with the same reference numerals, and repeated explanation of these structural elements is omitted.

Figure 14:
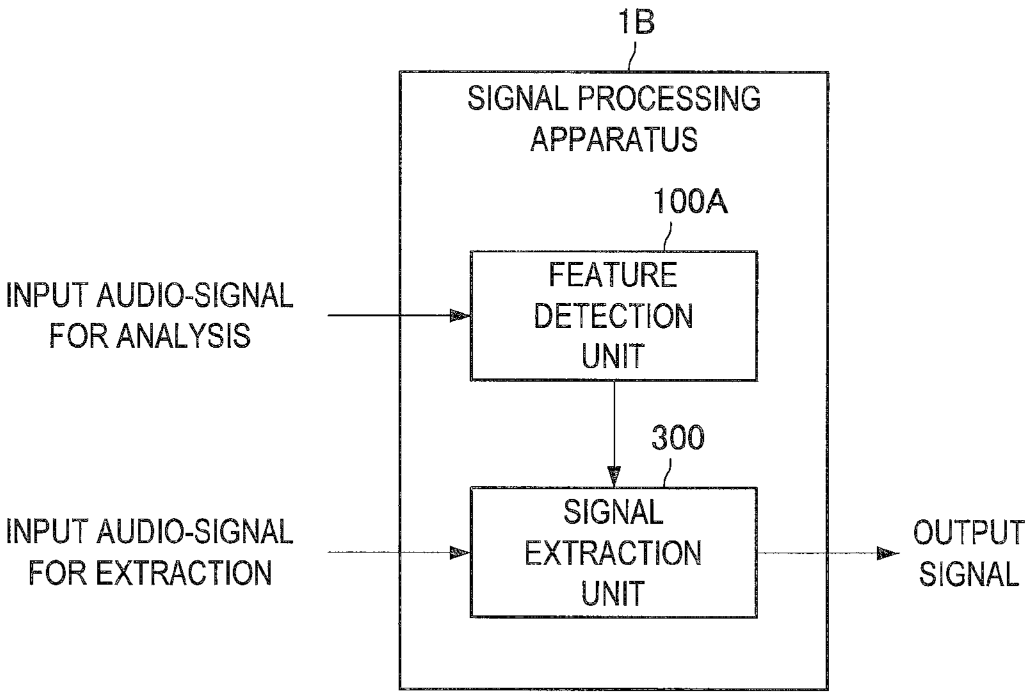
FIG. 14 is a diagram illustrating a functional configuration example of a signal processing apparatus according to a second embodiment of the present disclosure.

FIG. 14 is a diagram illustrating a functional configuration example of a signal processing apparatus 1B according to the second embodiment of the present disclosure. As illustrated in FIG. 14, the signal processing apparatus 1B according to the second embodiment of the present disclosure includes the feature detection unit 100A and a signal extraction unit 300. The feature detection unit 100A detects at least one of audience-generated-sound likelihood, music likelihood, and a tone from an input audio-signal for analysis, and supplies the signal extraction unit 300 with a detection signal obtained by the detection.

The signal extraction unit 300 adaptively extracts predetermined sound as extracted sound based on the detection signal supplied from the feature detection unit 100A. The predetermined sound as extracted sound may include at least one of surround sound and center sound. The surround sound is a signal obtained by reducing sound localized mainly in the center in the input signal. FIG. 14 illustrates an example in which the feature detection unit 100A and the signal extraction unit 300 are supplied with an input audio-signal for analysis and an input audio-signal for extraction, respectively. However, the same signal may be supplied as the input audio-signal for analysis to be supplied to the feature detection unit 100A and the input audio-signal for extraction to be supplied to the signal extraction unit 300.

Figure 15:
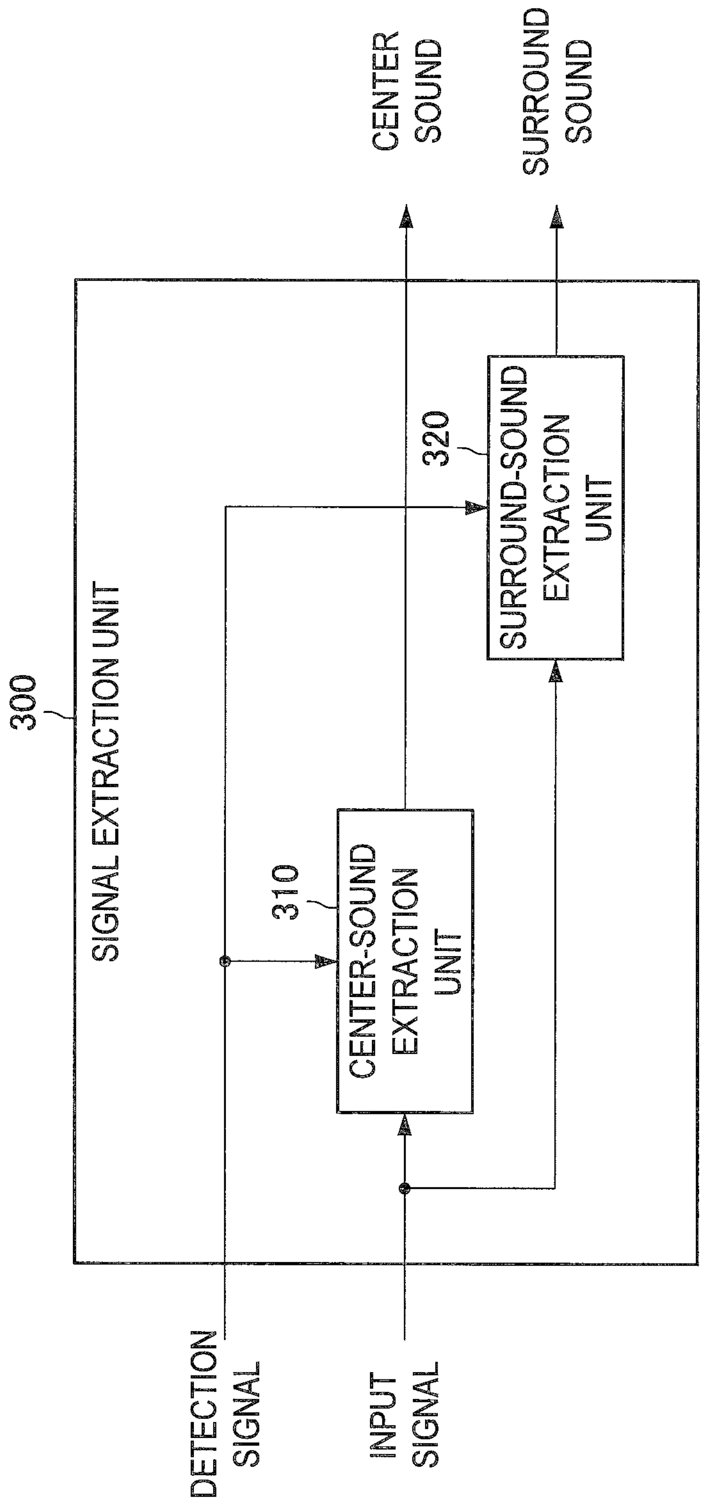
FIG. 15 is a diagram illustrating a detailed function example of a signal extraction unit according to the embodiment.

Subsequently, description is given of a detailed configuration example of the signal extraction unit 300 according to the second embodiment of the present disclosure. FIG. 15 is a diagram illustrating a detailed function example of the signal extraction unit 300 according to the second embodiment of the present disclosure. As illustrated in FIG. 15, the signal extraction unit 300 may include at least one of a center-sound extraction unit 310 and a surround-sound extraction unit 320.

The center-sound extraction unit 310 adaptively extracts center sound from an input signal according to the detection signal. The center-sound extraction unit 310 may add the extracted center sound to the input signal. The center sound made unclear due to reverberation addition, the sound-quality adjustment, or the like can thereby be made clear.

For example, the center-sound extraction unit 310 may be configured to extract the center sound when the music detection unit 120 judges the likelihood as music likelihood, and configured not to extract the center sound when the music detection unit 120 judges the likelihood as not music likelihood. The center sound is extracted according to the music likelihood in this way. In the case of not music likelihood (in a cheer scene), the extraction of the center sound is prevented, and thus deterioration of a spreading feeling can be prevented.

In addition, for example, the center-sound extraction unit 310 may be configured not to extract the center sound when the audience-generated-sound detection unit 110 judges the likelihood as audience-generated-sound likelihood, and configured to extract the center sound when the audience-generated-sound detection unit 110 judges the likelihood as not audience-generated-sound likelihood. As described above, also when the center sound is extracted according to the audience-generated-sound likelihood, the same function can be implemented.

The surround-sound extraction unit 320 adaptively extracts surround sound from the input signal according to the detection signal. The surround-sound extraction unit 320 may add the extracted surround sound to the input signal (a surround channel of the input signal). This can further enhance the presence in a cheer scene or the spreading feeling.

For example, when the music detection unit 120 judges the likelihood as music likelihood, the surround-sound extraction unit 320 may extract surround sound to such an extent that the clearness of the music is not deteriorated, so that the presence can be provided. When the music detection unit 120 judges the likelihood as not music likelihood, the surround-sound extraction unit 320 may extract the surround sound to a larger extent. The surround sound is extracted in this way according to the music likelihood. In the case of the music likelihood (in a music scene), the extraction of the surround sound is reduced, and thus deterioration of the clearness of the music can be prevented.

In addition, for example, when the audience-generated-sound detection unit 110 judges the likelihood as audience-generated-sound likelihood, the the surround-sound extraction unit 320 may extract surround sound to such an extent that the clearness of the music is not deteriorated, so that the presence can be provided. When the audience-generated-sound detection unit 110 judges the likelihood as not audience-generated-sound likelihood, the center-sound extraction unit 310 may extract the surround sound to a larger extent. The surround sound is extracted in this way according to the audience-generated-sound likelihood. As described above, also when the surround sound is extracted according to the audience-generated-sound likelihood, the same function can be implemented.

Figure 16:
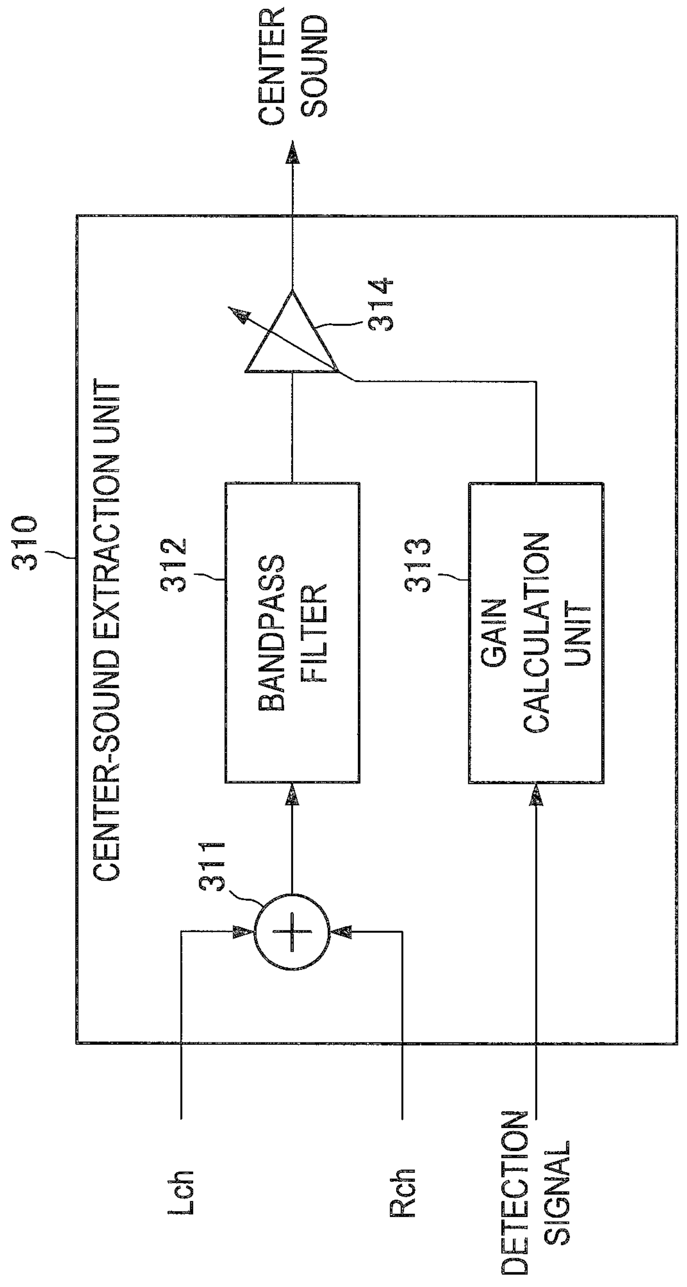
FIG. 16 is a diagram illustrating a detailed configuration example of a center-sound extraction unit according to the embodiment.

Subsequently, description is given of a detailed configuration example of the center-sound extraction unit 310 according to the second embodiment of the present disclosure. FIG. 16 is a diagram illustrating a detailed configuration example of the center-sound extraction unit 310 according to the second embodiment of the present disclosure. As illustrated in FIG. 16, the center-sound extraction unit 310 may include an adder 311, a bandpass filter 312, a gain calculation unit 313, and an amplifier 314.

The adder 311 adds up input signals through an L channel and an R channel. The bandpass filter 312 extracts a signal in a voice band by causing a signal resulting from the addition to pass the voice band. The gain calculation unit 313 calculates a gain by which the signal extracted by the bandpass filter 312 is multiplied, based on at least one of the music likelihood and the audience-generated-sound likelihood. The amplifier 314 outputs, as center sound, a result of multiplying the extracted signal by the gain.

Figure 17:
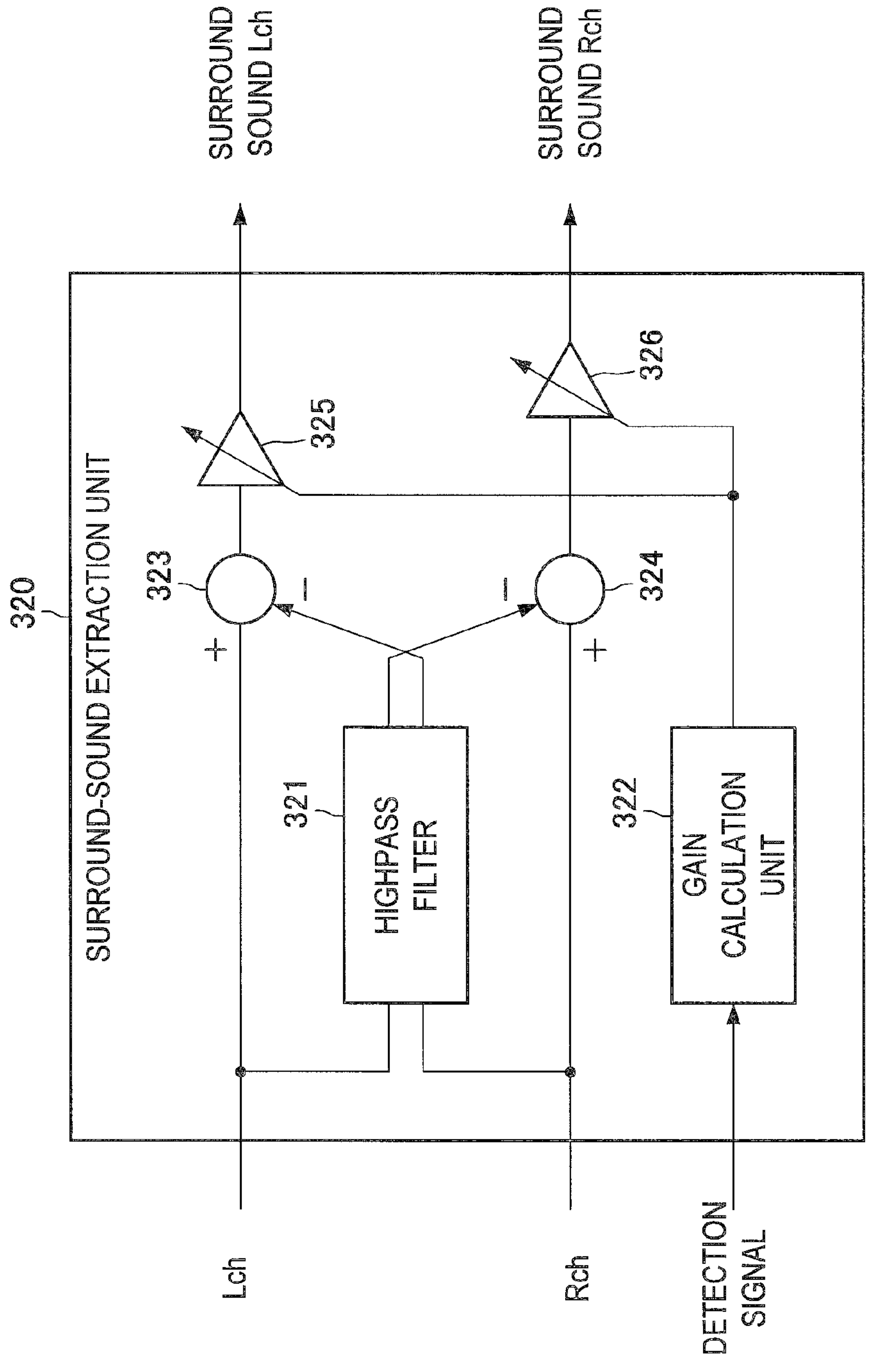
FIG. 17 is a diagram illustrating a detailed configuration example of a surround-sound extraction unit according to the embodiment.

Subsequently, description is given of a detailed configuration example of the surround-sound extraction unit 320 according to the second embodiment of the present disclosure. FIG. 17 is a diagram illustrating the detailed configuration example of the surround-sound extraction unit 320 according to the second embodiment of the present disclosure. As illustrated in FIG. 17, the surround-sound extraction unit 320 may include a highpass filter 321, a gain calculation unit 322, subtractors 323 and 324, and amplifiers 325 and 326. The surround-sound extraction unit 320 can enhance the presence in a music or cheer scene by extracting surround sound and by reproducing the extracted surround sound from a surround channel.

The surround sound can correspond to a signal obtained by subtracting one of input signals through an L channel and an R channel from the other one thereof by the corresponding one of the subtractors 323 and 324. However, a low-band component is often localized mainly in the center and has a low localization impression in audibility. For this reason, a low-band component of one of the signals which is to be subtracted from the other is removed by using the highpass filter 321, and then the one signal is subtracted from the other. This enables the surround sound to be generated without deteriorating the low-band component of the other signal from which the one signal is subtracted.

Figure 18:
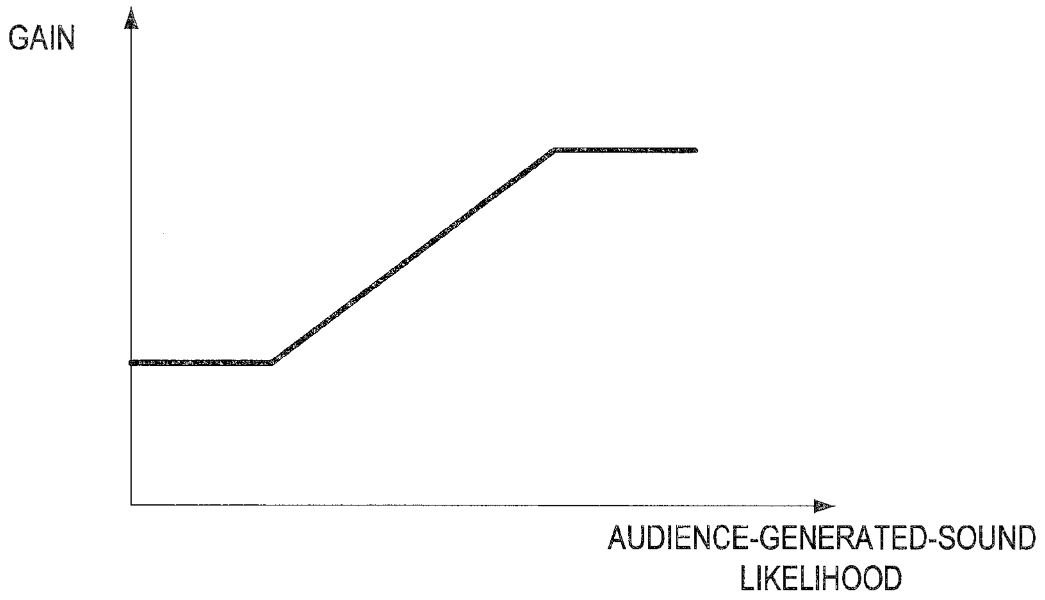
FIG. 18 is a diagram illustrating an example of a relationship between audience-generated sound and a gain.
Figure 19:
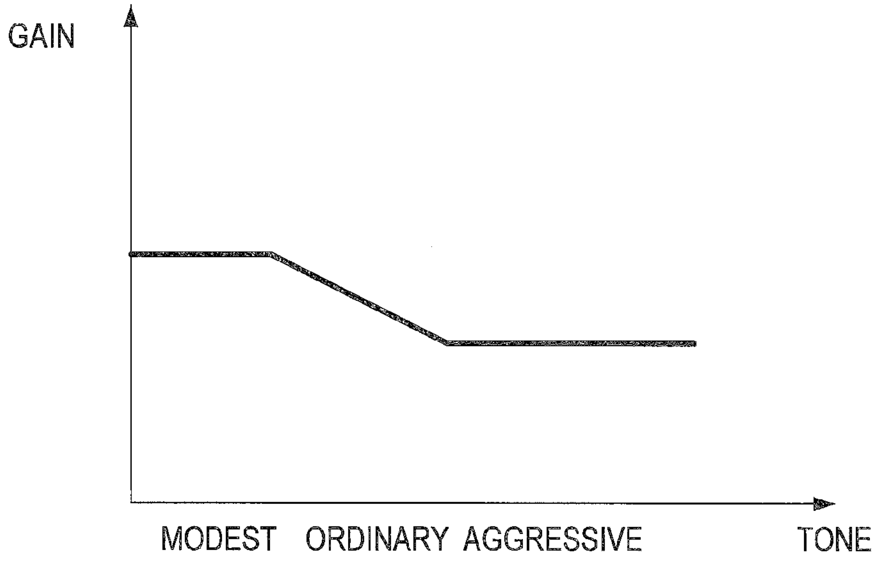
FIG. 19 is a diagram illustrating an example of a relationship between a tone and a gain.

The gain calculation unit 322 calculates a gain based on at least one of music likelihood and audience-generated-sound likelihood. Each of the amplifiers 325 and 326 outputs, as the extracted sound, a result of multiplying the subtraction result by the gain. For example, as illustrated in FIG. 18, the gain calculation unit 322 may increase the gain in the case of high audience-generated-sound likelihood, and thereby control is performed to enhance the presence and a spreading feeling. In addition, as illustrated in FIG. 19, when a tone is moderate, the gain calculation unit 322 may increase the gain, and thereby control is performed so that a more dynamic spreading feeling can be provided.

Figure 20:
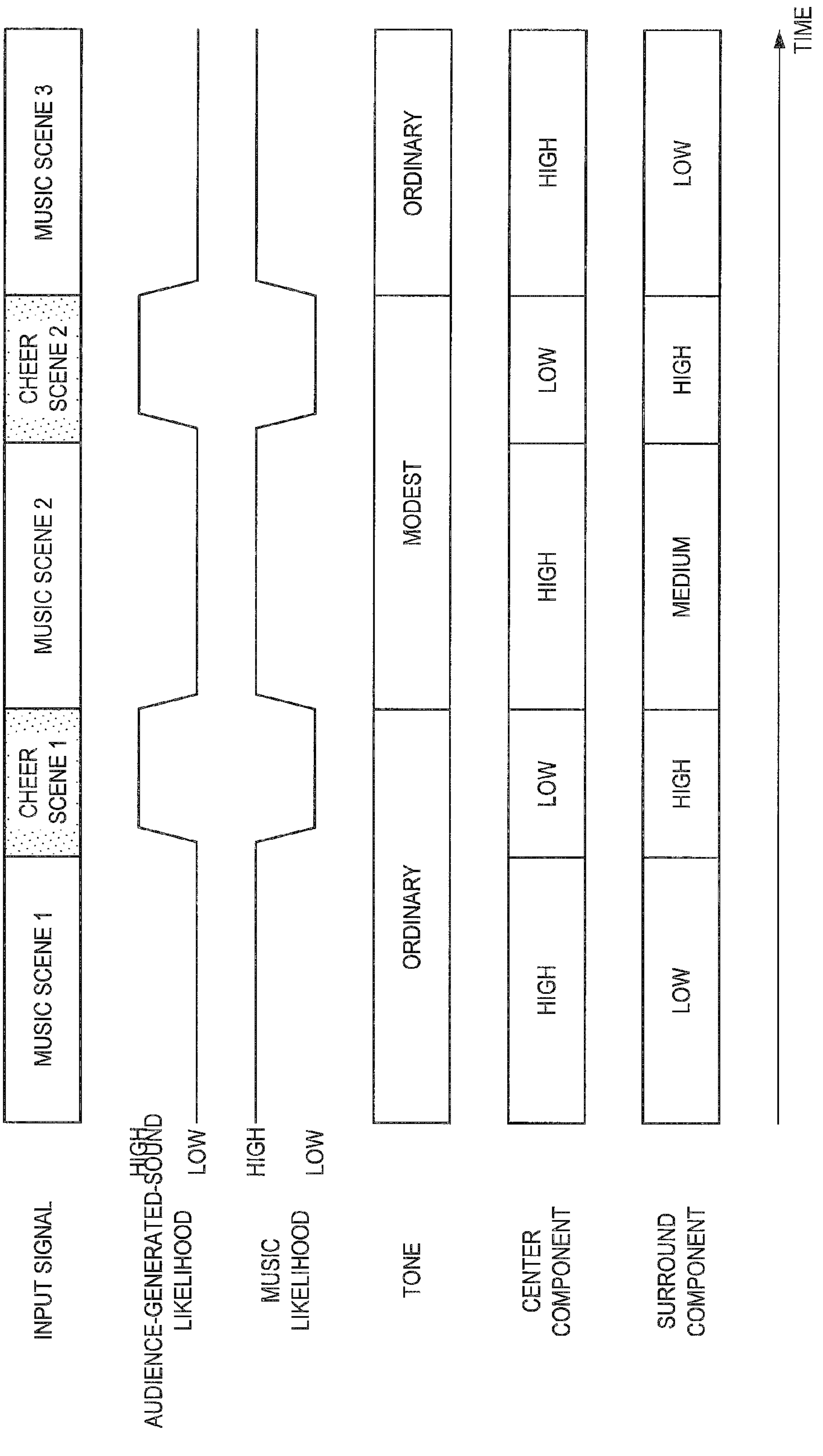
FIG. 20 is a diagram illustrating an example of the degree of each of a center component and a surround component.

FIG. 20 is a diagram illustrating an example of the degree of each of a center component and a surround component. The gain calculation unit 322 may calculate the gain so that the degrees of the center component and the surround component can be controlled according to the example in FIG. 20.

According to the second embodiment of the present disclosure as described above, presence appropriate for the scene of content and clear center sound are obtained. Since music arrives mainly at the front of the audience in the live music venue, sound to be supplied to a surround speaker for a music scene may be relatively faint sound to the extent of reflected sound. However, since the audience can be present in any orientation, relatively loud sound is preferably supplied to the surround speaker for a cheer scene. According to the second embodiment of the present disclosure, an amount of supplying the surround component can be increased for the cheer scene, and thus such presence that the listener feels like the listener is surrounded by a cheer in a live music venue can be obtained.

Meanwhile, processing for enhancing the presence such as reverberation addition or sound-quality adjustment might make the center sound unclear. For this reason, the center sound is extracted in the music scene, and is not extracted in the cheer scene. It is thereby possible to enhance the clearness of the center sound without deteriorating the spreading feeling in the cheer scene.

3. Third Embodiment

Subsequently, description is given of a third embodiment of the present disclosure. Structural elements in the third embodiment of the present disclosure that have substantially the same function and structure as in the first and second embodiments of the present disclosure are denoted with the same reference numerals, and repeated explanation of these structural elements is omitted.

Figure 21:
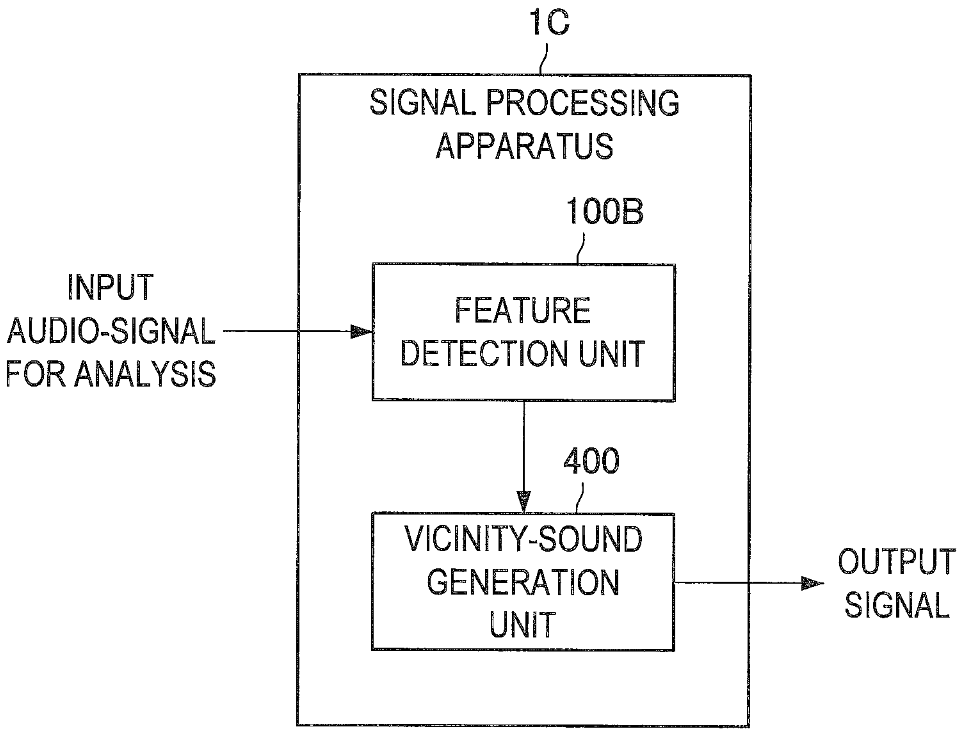
FIG. 21 is a diagram illustrating a functional configuration example of a signal processing apparatus according to a third embodiment of the present disclosure.

FIG. 21 is a diagram illustrating a functional configuration example of a signal processing apparatus 1C according to the third embodiment of the present disclosure. As illustrated in FIG. 21, the signal processing apparatus 1C according to the third embodiment of the present disclosure includes a feature detection unit 100B and a vicinity-sound generation unit 400. The feature detection unit 100B detects, from an input audio-signal for analysis, at least one of audience-generated-sound likelihood, the type of audience-generated sound, and music likelihood, and supplies the signal extraction unit 300 with a detection signal obtained by the detection.

Based on the detection signal supplied from the feature detection unit 100B, the vicinity-sound generation unit 400 generates sound uttered by the audience near an audio-input-signal detection location in the live music venue (such as voices, whistling sounds, and applause sounds). Hereinafter, the sound uttered by the neighboring audience is also referred to as vicinity sound.

Figure 22:
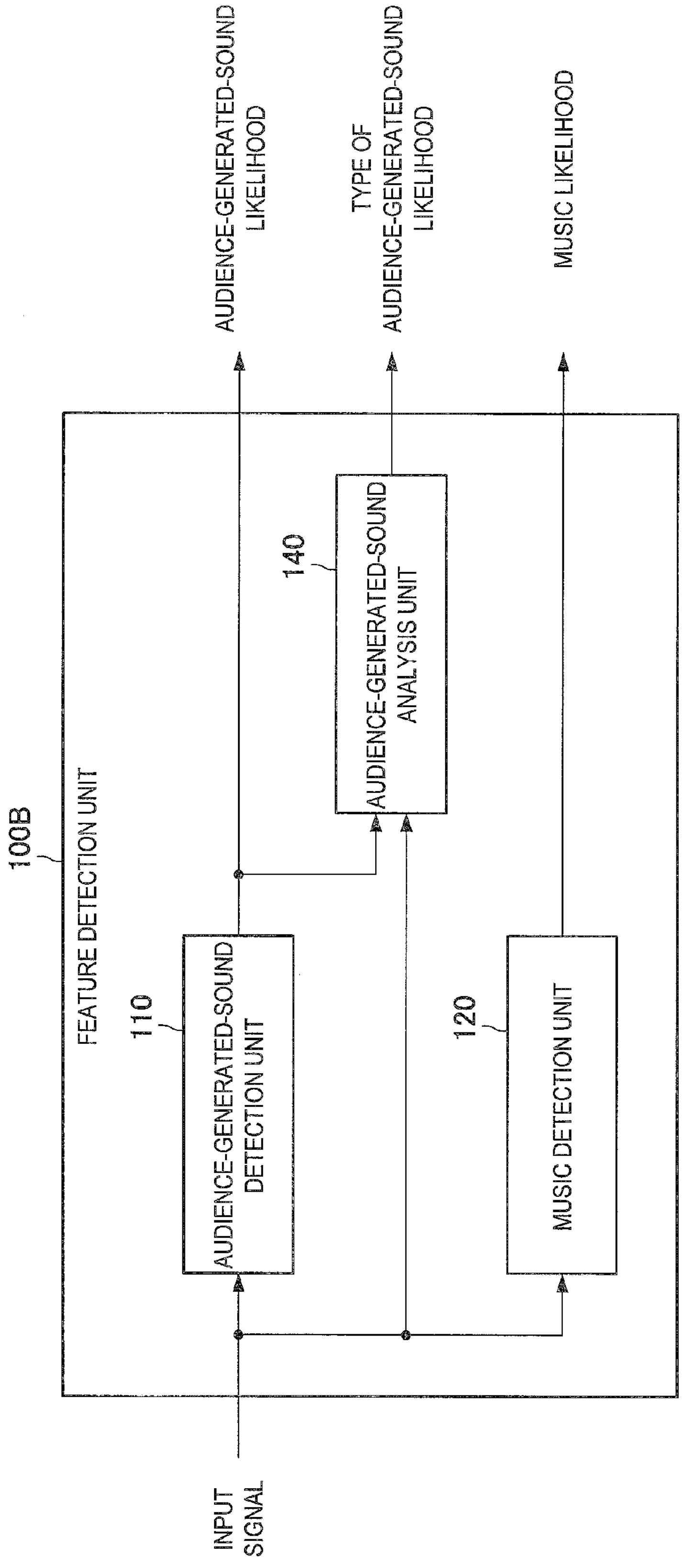
FIG. 22 is a diagram illustrating a detailed configuration example of a feature detection unit according to the embodiment.

Subsequently, description is given of a detailed configuration example of the feature detection unit 100B according to the third embodiment of the present disclosure. FIG. 22 is a diagram illustrating a detailed configuration example of the feature detection unit 100B according to the third embodiment of the present disclosure. The feature detection unit 100B may include at least one of the audience-generated-sound detection unit 110, the music detection unit 120, and an audience-generated-sound analysis unit 140. When the audience-generated-sound detection unit 110 judges the likelihood as cheer likelihood, the audience-generated-sound analysis unit 140 detects the type of audience-generated sound.

Figure 23:
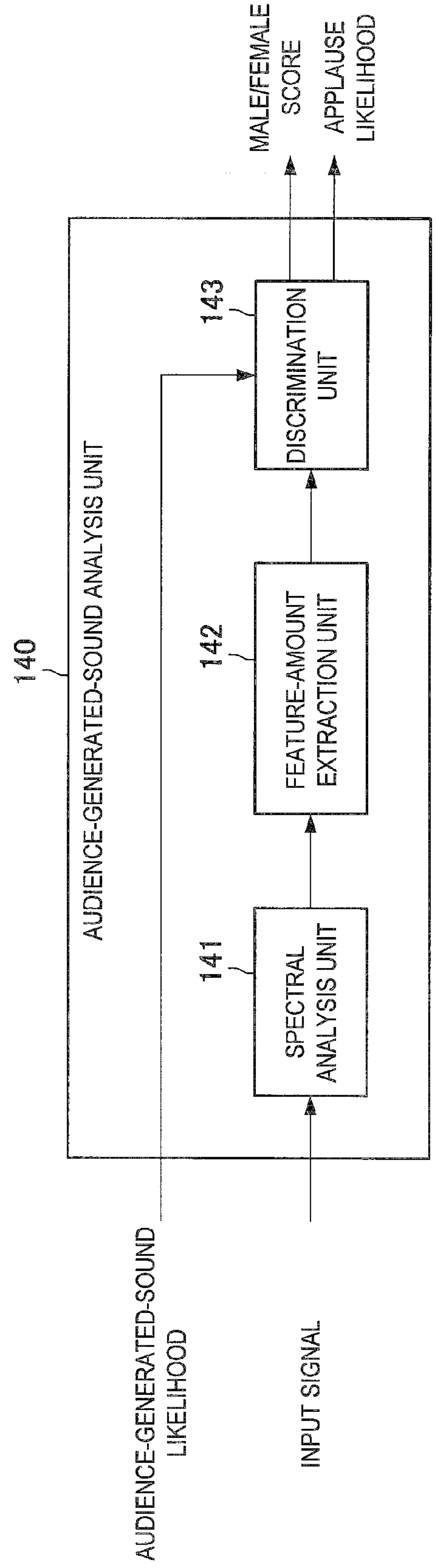
FIG. 23 is a diagram illustrating a detailed configuration example of an audience-generated-sound analysis unit according to the embodiment.

Subsequently, description is given of a detailed configuration example of the audience-generated-sound analysis unit 140 according to the third embodiment of the present disclosure. FIG. 23 is a diagram illustrating the detailed configuration example of the audience-generated-sound analysis unit 140 according to the third embodiment of the present disclosure. As illustrated in FIG. 23, the audience-generated-sound analysis unit 140 may include a spectral analysis unit 141, a feature-amount extraction unit 142, and a discrimination unit 143.

The spectral analysis unit 141 performs a spectral analysis on the input signal and supplies the feature-amount extraction unit 142 with a spectrum obtained as the analysis result. A method for the spectral analysis is not particularly limited, and may be based on a time domain or a frequency domain. The feature-amount extraction unit 142 extracts a feature amount (such as a voice-band spectral shape) based on the spectrum supplied from the spectral analysis unit 141, and supplies the discrimination unit 143 with the extracted feature amount.

The discrimination unit 143 discriminates a type of audience-generated sound based on the feature amount (such as a voice-band spectral shape) extracted by the feature-amount extraction unit 142. The following describes a specific example. For example, when a spectral peak in the voice band is present in a male-voice band (about 700 to 800 Hz) as in a spectrum 1 in FIG. 24, the discrimination unit 143 may discriminate a male cheer (or a dominant male cheer) as the type of audience-generated sound.

Figure 24:
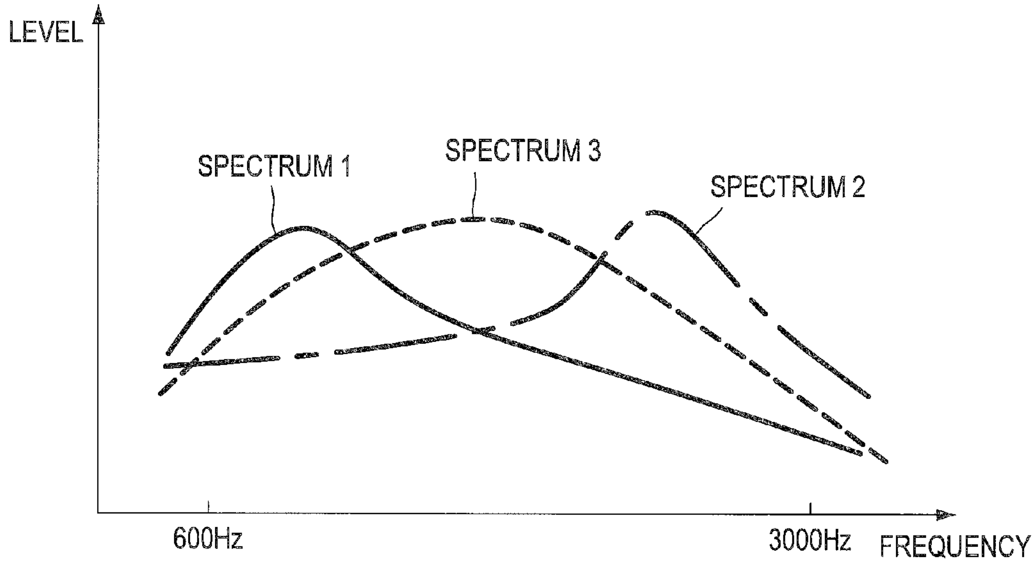
FIG. 24 is a diagram illustrating an example of a relationship between a band of a peak and a type of audience-generated sound.

In contrast, when a spectral peak in the voice band is present in a female-voice band (about 1.1 to 1.3 kHz) as in a spectrum 2 in FIG. 24, the discrimination unit 143 may discriminate a female cheer (or a dominant female cheer) as the type of audience-generated sound. When a peak is present between the voice bands as in a spectrum 3 in FIG. 24, the discrimination unit 143 may discriminate a mixture of male and female cheers as the type of audience-generated sound.

Figure 25:
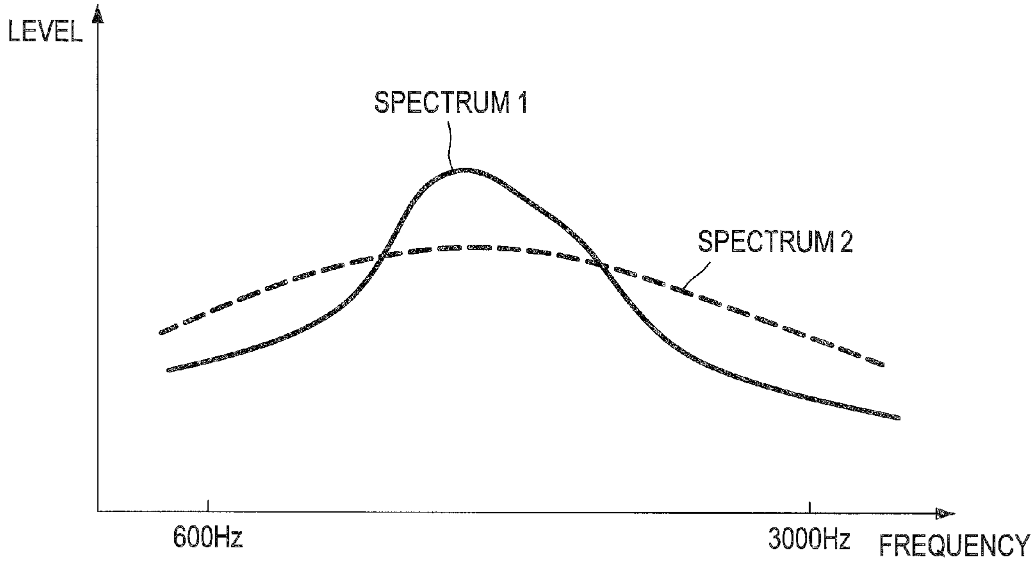
FIG. 25 is a diagram illustrating an example of a relationship between the degree of sharpness of a peak and the type of audience-generated sound.

In addition, when a peak has a sharper shape than a threshold shape as in the spectrum 1 in FIG. 25, the discrimination unit 143 may discriminate voice (or dominant voice) as the type of audience-generated sound. In contrast, when a peak has a gentler shape than a threshold shape as in the spectrum 2 in FIG. 2, the discrimination unit 143 may discriminate applause sound (or a dominant applause sound) as the type of audience-generated sound.

The vicinity-sound generation unit 400 generates vicinity sound based on the detection signal. For example, suppose a condition that audience-generated-sound likelihood is higher than a threshold and a condition that music likelihood is lower than a threshold. When at least one of the conditions is satisfied, the vicinity-sound generation unit 400 may generate vicinity sound. In contrast, suppose a condition that the audience-generated-sound likelihood is lower than the threshold and a condition that the music likelihood is higher than the threshold. When at least one of the conditions is satisfied, the vicinity-sound generation unit 400 does not have to generate vicinity sound to avoid unnatural addition of the vicinity sound to a tune (or may generate fainter vicinity sound).

When the type of audience-generated sound is a male cheer (or a dominant male cheer), the vicinity-sound generation unit 400 may generate vicinity sound including a male voice. In contrast, when the type of audience-generated sound is a female cheer (or a dominant female cheer), the vicinity-sound generation unit 400 may generate vicinity sound including a female voice. When the type of audience-generated sound is applause sound (or a dominant applause sound), the vicinity-sound generation unit 400 may generate vicinity sound including applause sound. In this way, it is possible to generate such vicinity sound that naturally fits in an input signal.

The vicinity sound may be added to the input signal by the vicinity-sound generation unit 400. This makes it possible to enjoy a sound field having the vicinity sound added thereto. Note that a method for generating vicinity sound used by the vicinity-sound generation unit 400 is not limited. For example, the vicinity-sound generation unit 400 may generate vicinity sound by reproducing vicinity sound recorded in advance. The vicinity-sound generation unit 400 may also generate vicinity sound in a pseudo manner, like a synthesizer. Alternatively, the vicinity-sound generation unit 400 may generate vicinity sound by removing a reverberation component from the input signal.

According to the third embodiment of the present disclosure as described above, sounds (such as voices, whistling sounds, and applause sounds) are generated which are uttered by the neighboring audience and are difficult to record in content, and thereby it is possible to provide such absorption feeling and presence that a listener feels like directly listening to music played in the live music venue. Analyzing the content and adding an easy-to-fit vicinity sound matching a cheer scene enables a natural sound field to be generated without abruptly adding vicinity sound to a non-cheer scene.

4. Fourth Embodiment

Subsequently, description is given of a fourth embodiment of the present disclosure. Structural elements in the fourth embodiment of the present disclosure that have substantially the same function and structure as in the first to third embodiments of the present disclosure are denoted with the same reference numerals, and repeated explanation of these structural elements is omitted.

Figure 26:
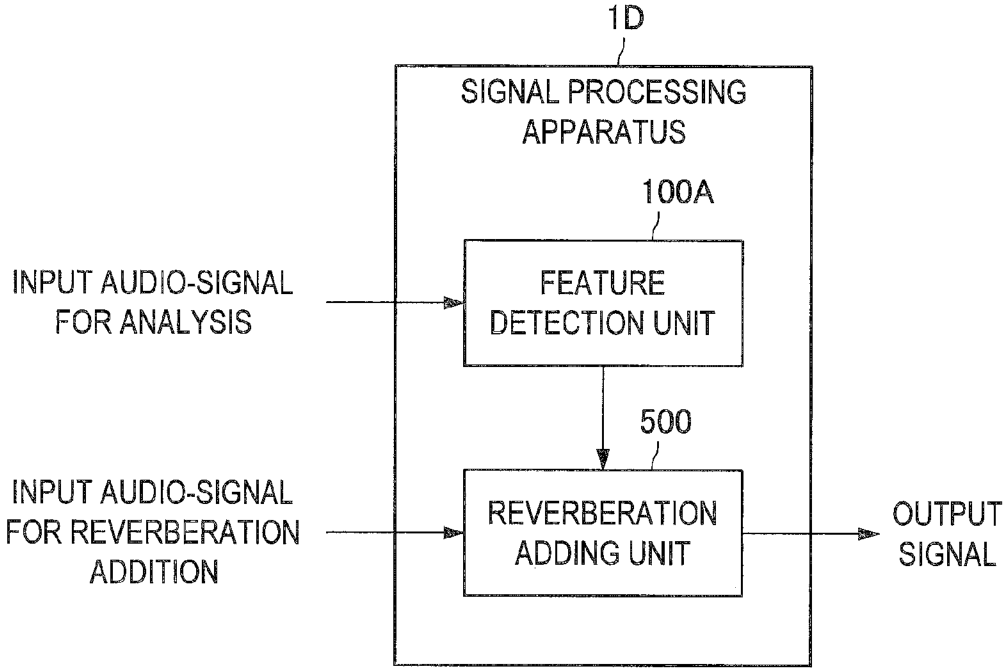
FIG. 26 is a diagram illustrating a functional configuration example of a signal processing apparatus according to a fourth embodiment of the present disclosure.

FIG. 26 is a diagram illustrating a functional configuration example of a signal processing apparatus 1D according to the fourth embodiment of the present disclosure. As illustrated in FIG. 26, the signal processing apparatus 1D according to the fourth embodiment of the present disclosure includes the feature detection unit 100A and a reverberation adding unit 500. The feature detection unit 100A detects at least one of audience-generated-sound likelihood, music likelihood, and a tone from an input audio-signal for analysis, and supplies the reverberation adding unit 500 with a detection signal obtained by the detection.

The reverberation adding unit 500 adaptively adds reverberation to an input signal based on the detection signal. FIG. 26 shows an example in which the feature detection unit 100A and the reverberation adding unit 500 are supplied with the input audio-signal for analysis and an input audio-signal for reverberation addition, respectively. However, the same signal may be supplied as the input audio-signal for analysis to be supplied to the feature detection unit 100A and the input audio-signal for reverberation addition supplied to the reverberation adding unit 500.

The reverberation adding unit 500 may add reverberation according to a tone detected by the tone detection unit 130. For example, when a moderate tone is discriminated, the reverberation adding unit 500 may set a longer reverberation time. This makes it possible to generate a more spreading and dynamic sound field. In contrast, when an ordinary tone (such as rock or pop) is discriminated, the reverberation adding unit 500 may set a shorter reverberation time. This makes it possible to avoid loss of clearness of fast passage or the like.

In addition, when audience-generated-sound likelihood is discriminated, the reverberation adding unit 500 may set a longer reverberation time. This can generate a sound field having higher presence and thus can liven up the content. Vicinity sound may be added to the input signal by the vicinity-sound generation unit 400. This makes it possible to enjoy a sound field having vicinity sound added thereto.

According to the fourth embodiment of the present disclosure as described above, appropriately adjusting a reverberation characteristic according to a tone or a scene makes it possible to generate a clear sound field having a more spreading feeling. A characteristic having a relatively short reverberation time is set for a tune in quick tempo to prevent short passages from becoming unclear, while a characteristic having a relatively long reverberation time is set for a slow tune or a cheer scene. It is thereby possible to generate a sound field having dynamic presence.

5. Combination of Embodiments

Subsequently, description is given of a fifth embodiment of the present disclosure. Two or more of the first to fourth embodiments described above can be appropriately combined in the fifth embodiment of the present disclosure. It is thereby expected to be able to provide a listener with such further higher presence that the listener feels like directly listening to audio emitted in the live music venue. An example of combining all the first to fourth embodiments will be described in the fifth embodiment of the present disclosure.

Figure 27:
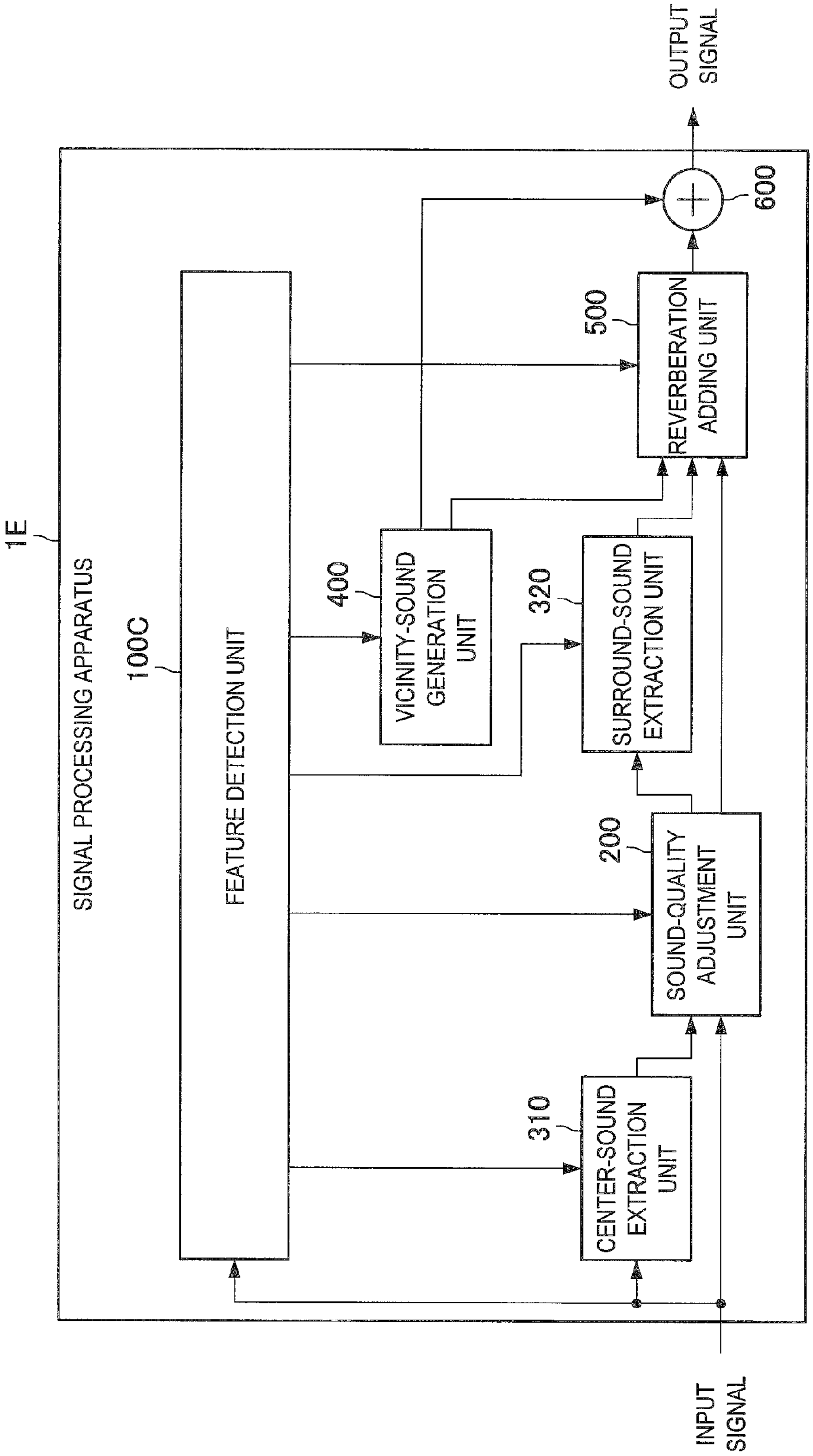
FIG. 27 is a diagram illustrating a functional configuration example of a signal processing apparatus according to a fifth embodiment of the present disclosure.

FIG. 27 is a diagram illustrating a functional configuration example of a signal processing apparatus lE according to the fifth embodiment of the present disclosure. As illustrated in FIG. 27, the signal processing apparatus lE according to the fifth embodiment of the present disclosure includes a feature detection unit 100C, the center-sound extraction unit 310, the sound-quality adjustment unit 200, the surround-sound extraction unit 320, the vicinity-sound generation unit 400, the reverberation adding unit 500, and an adder 600.

The feature detection unit 100C detects a feature amount from an input signal and supplies the detected feature amount to the center-sound extraction unit 310, the surround-sound extraction unit 320, the sound-quality adjustment unit 200, the vicinity-sound generation unit 400, and the reverberation adding unit 500. The center-sound extraction unit 310 extracts center sound according to music likelihood supplied from the feature detection unit 100C, and supplies the sound-quality adjustment unit 200 with the extracted center sound. The sound-quality adjustment unit 200 adjusts the sound quality of each of the input signal and the center sound based on a tone supplied from the feature detection unit 100C, and supplies the surround-sound extraction unit 320 and the reverberation adding unit 500 with the input signal and the center sound that have undergone the sound-quality adjustment.

The surround-sound extraction unit 320 extracts surround sound from the input signal having undergone the audio adjustment according to audience-generated-sound likelihood supplied from the feature detection unit 100C, and supplies the reverberation adding unit 500 with the surround sound. The vicinity-sound generation unit 400 generates vicinity sound according to the feature amount (such as audience-generated-sound likelihood, the type of audience-generated sound, or music likelihood) supplied from the feature detection unit 100C, and supplies the reverberation adding unit 500 with the generated vicinity sound.

According to a tone supplied from the feature detection unit 100C, the reverberation adding unit 500 adds reverberation to an input signal supplied from each of the sound-quality adjustment unit 200, the surround-sound extraction unit 320, and the vicinity-sound generation unit 400. The adder 600 adds the vicinity sound generated by the vicinity-sound generation unit 400 to an output signal from the reverberation adding unit 500.

Figure 28:
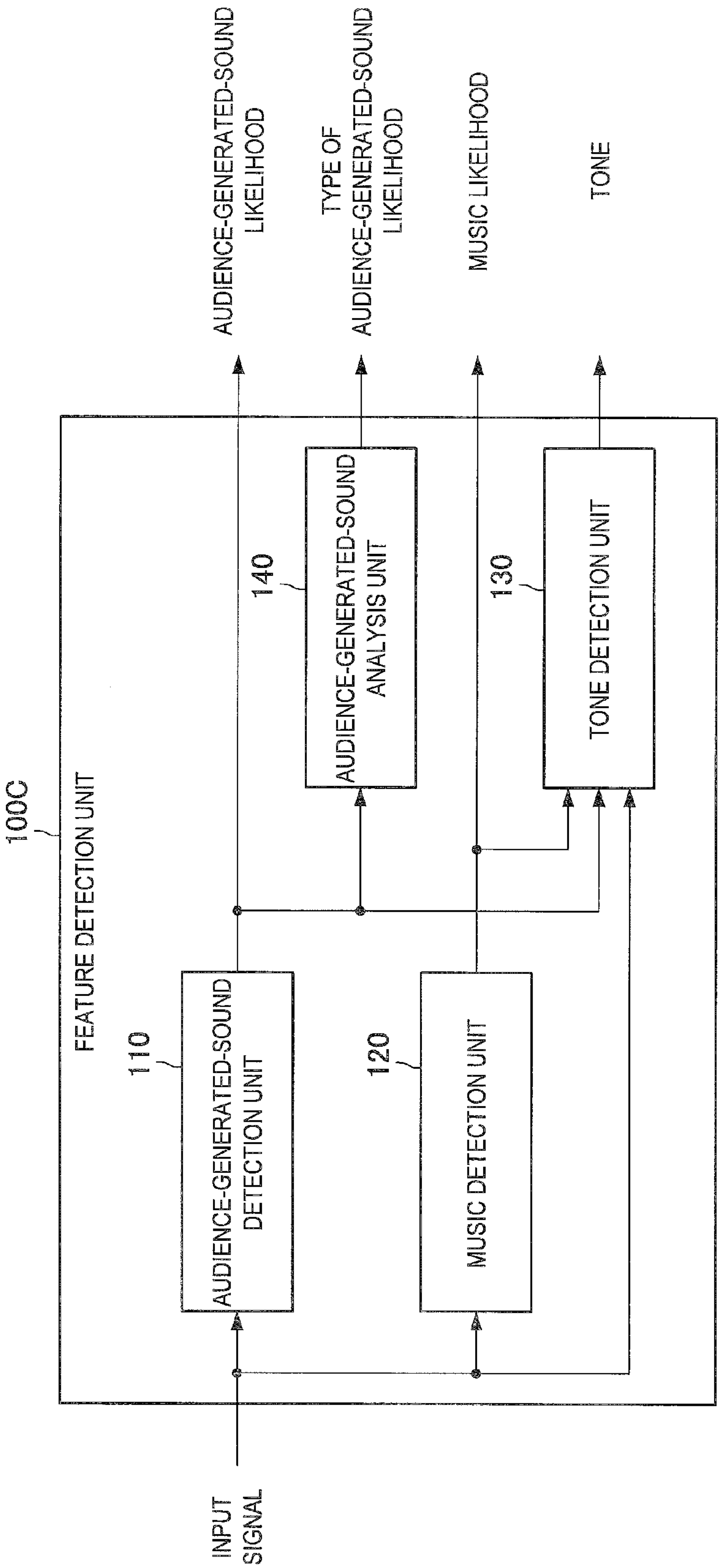
FIG. 28 is a diagram illustrating a functional configuration example of a feature detection unit according to the embodiment.

FIG. 28 is a diagram illustrating a functional configuration example of the feature detection unit 100C according to the fifth embodiment of the present disclosure. As illustrated in FIG. 28, the feature detection unit 100C has the audience-generated-sound detection unit 110, the music detection unit 120, the tone detection unit 130, and the audience-generated-sound analysis unit 140. As in the example, it is possible to provide the feature detection unit 100C having all of the audience-generated-sound detection unit 110, the music detection unit 120, the tone detection unit 130, and the audience-generated-sound analysis unit 140.

Figure 29:
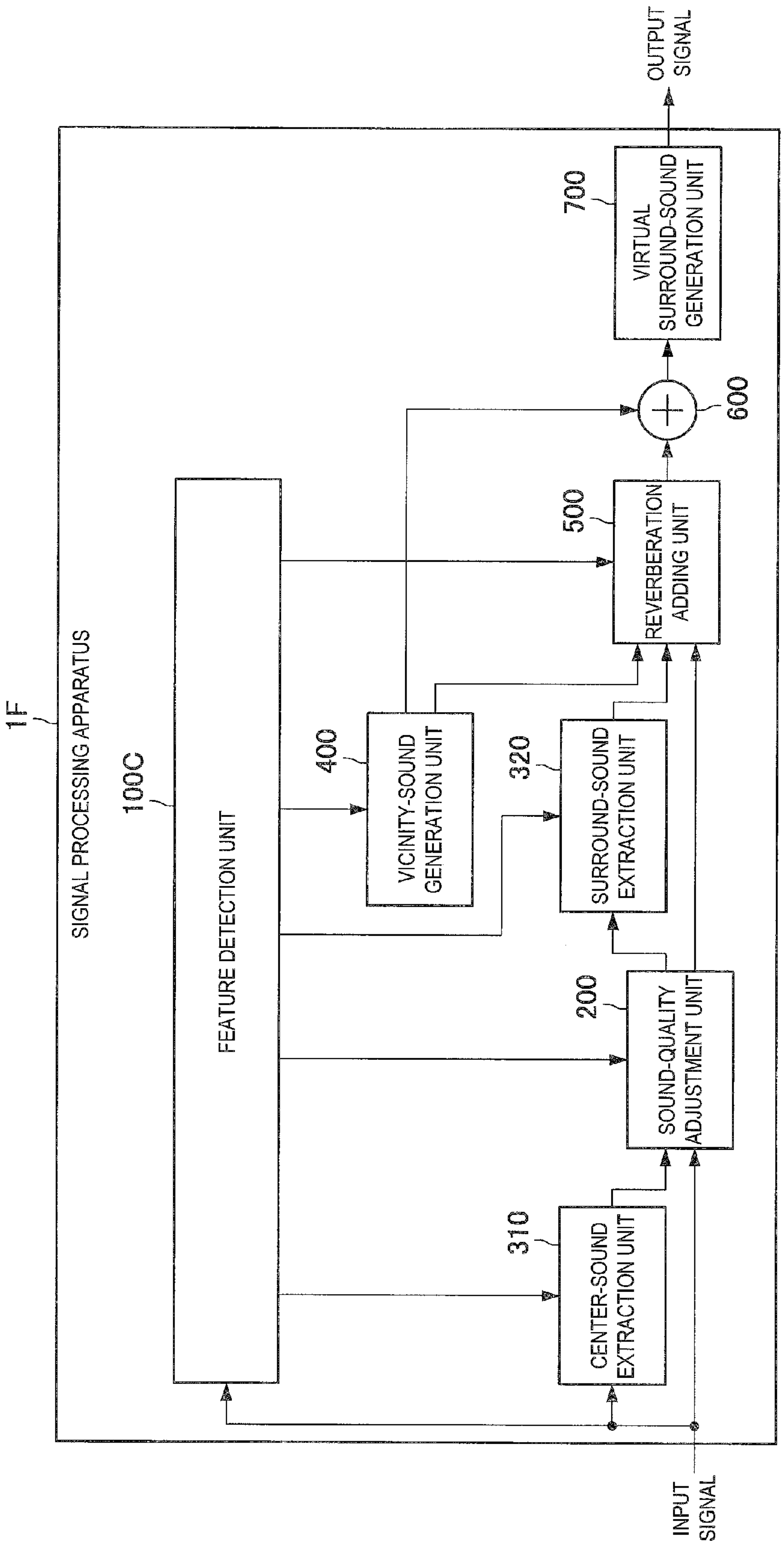
FIG. 29 is a diagram illustrating a functional configuration example of a signal processing apparatus according to the fifth embodiment.

Meanwhile, FIG. 29 is a diagram illustrating a functional configuration example of a signal processing apparatus 1F according to the fifth embodiment of the present disclosure.

As illustrated in FIG. 29, the signal processing apparatus lE according to the fifth embodiment of the present disclosure may further include a virtual surround-sound generation unit 700. A surround component of the output signal from the aforementioned signal processing apparatus lE is reproduced from a surround speaker, but may be reproduced from only a front speaker by using virtual sound of the virtual surround-sound generation unit 700.

6. Hardware Configuration Example of Signal Processing Apparatus

Figure 30:
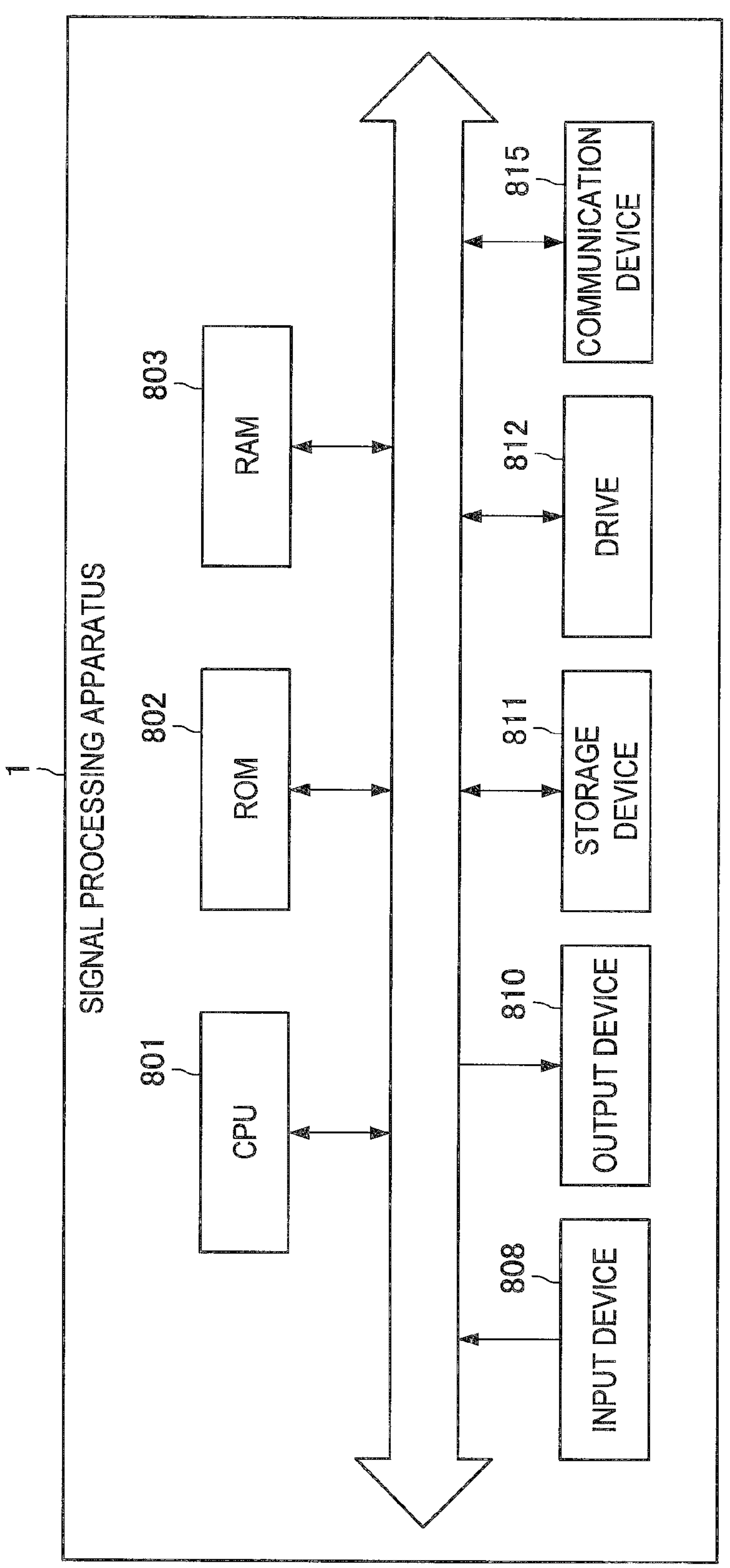
FIG. 30 is a diagram illustrating a hardware configuration example of a signal processing apparatus.

Subsequently, description is given of a hardware configuration example of the signal processing apparatus 1 according to the embodiments of the present disclosure. FIG. 30 is a diagram illustrating the hardware configuration example of the signal processing apparatus 1 according to the embodiments of the present disclosure. However, the hardware configuration example in FIG. 30 merely shows an example of the hardware configuration of the signal processing apparatus 1. Accordingly, the hardware configuration of the signal processing apparatus 1 is not limited to the example in FIG. 30.

As illustrated in FIG. 30, the signal processing apparatus 1 includes a central processing unit (CPU) 801, a read only memory (ROM) 802, a random access memory (RAM) 803, an input device 808, an output device 810, a storage device 811, a drive 812, and a communication device 815.

The CPU 801 functions as an arithmetic processing unit and a control unit, and controls overall operation of the signal processing apparatus 1 according to a variety of programs. The CPU 801 may also be a microprocessor. The ROM 802 stores therein the programs, operational parameters, and the like that are used by the CPU 801. The RAM 803 temporarily stores therein the programs used and executed by the CPU 801, parameters appropriately varying in executing the programs, and the like. These are connected to each other through a host bus configured of a CPU bus or the like.

The input device 808 includes: an operation unit for inputting information by a user, such as a mouse, a keyboard, a touch panel, buttons, a microphone, a switch, or a lever; an input control circuit that generates input signals based on input by the user and outputs the signals to the CPU 801; and the like. By operating the input device 808, the user of the signal processing apparatus 1 can input various data and give the signal processing apparatus 1 instructions for processing operation.

The output device 810 may include a display device such as a liquid crystal display (LCD) device, an organic light emitting diode (OLED) device, or a lamp. The output device 810 may further include an audio output device such as a speaker or a headphone. For example, the display device displays a captured image, a generated image, and the like, while the audio output device converts audio data and the like into audio and outputs the audio.

The storage device 811 is a device for storing data configured as an example of a storage unit of the signal processing apparatus 1. The storage device 811 may include a storage medium, a recorder that records data in the storage medium, a reader that reads data from the storage medium, a deletion device that deletes data recorded in the storage medium, and the like. The storage device 811 stores therein the programs executed by the CPU 801 and various data.

The drive 812 is a reader/writer and is built in or externally connected to the signal processing apparatus 1. The drive 812 reads information recorded in the removable storage medium loaded in the drive 812 such as a magnetic disk, an optical disk, a magneto-optical disk, or a semiconductor memory, and outputs the information to the RAM 803. The drive 812 can also write information to the removable storage medium.

The communication device 815 is a communication interface configured of a communication device or the like for connecting to, for example, a network. The communication device 815 may be a communication device supporting a wireless local area network (LAN), a communication device supporting long term evolution (LTE), or a wired communication device that performs wired communication. The communication device 815 can communicate with another device, for example, through a network. The description has heretofore given of the hardware configuration example of the signal processing apparatus 1 according to the embodiments of the present disclosure.

7. Conclusion

According to each of the first to fourth embodiments of the present disclosure as described above, it is possible to provide a listener with such higher presence that the listener feels like directly listening to audio emitted in a live music venue. According to the fifth embodiment of the present disclosure, it is expected to be able to provide the listener with further higher presence by appropriately combining two or more of the first to fourth embodiments of the present disclosure.

It should be understood by those skilled in the art that various modifications, combinations, sub-combinations and alterations may occur depending on design requirements and other factors insofar as they are within the scope of the appended claims or the equivalents thereof.

It is also possible to generate a program for causing the hardware such as the CPU, the ROM, and the RAM which are built in a computer to exert functions equivalent to those of the aforementioned signal processing apparatus 1. There can also be provided a computer-readable storage medium storing the program.

In addition, the advantageous effects described in the specification are merely explanatory or illustrative, and are not limited. In other words, the technology according to the present disclosure can exert other advantageous effects that are clear to those skilled in the art from the description of the specification, in addition to or instead of the advantageous effects described above.

Additionally, the present technology may also be configured as below.

(1)

A signal processing apparatus including:

a feature detection unit configured to detect, from an input signal, a detection signal including at least one of audience-generated-sound likelihood and music likelihood; and a vicinity-sound generation unit configured to generate vicinity sound based on the detection signal.

(2)

The signal processing apparatus according to (1), wherein the feature detection unit further detects a type of audience-generated sound from the input signal, and wherein the vicinity-sound generation unit generates vicinity sound appropriate for the type of audience-generated sound.

(3)

The signal processing apparatus according to (2), wherein the type of audience-generated sound includes at least one of a male cheer, a female cheer, a whistle, and applause sound.

(4)

The signal processing apparatus according to any one of (1) to (3), wherein the vicinity-sound generation unit adds the vicinity sound to the input signal.

(5)

The signal processing apparatus according to any one of (1) to (4), further including:

a sound-quality adjustment unit configured to perform sound-quality adjustment based on the detection signal.

(6)

The signal processing apparatus according to (5), wherein the feature detection unit further detects a tone from the input signal, and wherein the sound-quality adjustment unit performs the sound-quality adjustment appropriate for the tone.

(7)

The signal processing apparatus according to (5) or (6), wherein the sound-quality adjustment unit performs at least dynamic range control as the sound-quality adjustment.

(8)

The signal processing apparatus according to any one of (1) to (7), further including:

a signal extraction unit configured to extract predetermined sound as extracted sound from the input signal based on the detection signal.

(9)

The signal processing apparatus according to (8), wherein the predetermined sound as extracted sound includes at least one of center sound and surround sound.

(10)

The signal processing apparatus according to (8) or (9), wherein the signal extraction unit adds the extracted sound to the input signal.

(11)

The signal processing apparatus according to any one of (1) to (10), further including:

a reverberation adding unit configured to add reverberation to the input signal based on the detection signal.

(12)

The signal processing apparatus according to (11), wherein the feature detection unit further detects a tone from the input signal, and wherein the reverberation adding unit adds reverberation appropriate for the tone.

(13)

A signal processing method including:

detecting, from an input signal, a detection signal including at least one of audience-generated-sound likelihood and music likelihood; and causing a processor to generate vicinity sound based on the detection signal.

(14)

A program for causing a computer to function as a signal processing apparatus including:

a feature detection unit configured to detect, from an input signal, a detection signal including at least one of audience-generated-sound likelihood and music likelihood; and a vicinity-sound generation unit configured to generate vicinity sound based on the detection signal.

What is claimed is:

1. A signal processing apparatus, comprising:

a feature detection unit configured to detect, from an input signal, a detection signal wherein the detection signal includes at least one of an audience-generated-sound likelihood or a music likelihood, and wherein the feature detection unit includes a tone detection unit configured to:

acquire a spectrum based on a spectral analysis on the input signal, extract a feature amount of the input signal based on the acquired spectrum, and detect a tone of the input signal based on the extracted feature amount;

a reverberation adding unit configured to add reverberation to the input signal based on the detected tone of the input signal, wherein for a moderate tone a longer reverberation time is set while for an ordinary tone a shorter reverberation time is set; and a vicinity-sound generation unit configured to generate audience-generated sound based on the detection signal.

2. The signal processing apparatus according to claim 1, wherein the feature detection unit is further configured to detect a type of the audience-generated sound from the input signal, and wherein the vicinity-sound generation unit is further configured to generate the audience-generated sound based on the type of the audience-generated sound.

3. The signal processing apparatus according to claim 2, wherein the type of the audience-generated sound includes at least one of a male cheer, a female cheer, a whistle, or applause sound.

4. The signal processing apparatus according to claim 1, further comprising a sound-quality adjustment unit configured to adjust a sound-quality based on the detection signal.

5. The signal processing apparatus according to claim 4, wherein the sound-quality adjustment unit is further configured to adjust the sound-quality based on the tone.

6. The signal processing apparatus according to claim 4, wherein the sound-quality adjustment unit is further configured to:

control at least a dynamic range of the input signal; and adjust the sound-quality based on the dynamic range.

7. The signal processing apparatus according to claim 1, further comprising a signal extraction unit configured to extract sound from the input signal based on the detection signal.

8. The signal processing apparatus according to claim 7, wherein the sound includes at least one of center sound or surround sound.

9. The signal processing apparatus according to claim 1, wherein the vicinity-sound generation unit is further configured to add vicinity-sound to the input signal.

10. The signal processing apparatus according to claim 1, wherein the feature amount corresponds to at least one of a spectral shape, a degree of a spectral peak, an average of a low-band level of the spectrum or a density of the low-band level of the spectrum.

11. A signal processing method, comprising:

detecting, from an input signal, a detection signal wherein the detection signal includes at least one of an audience-generated-sound likelihood or a music likelihood, acquiring a spectrum based on a spectral analysis on the input signal;

extracting a feature amount of the input signal based on the acquired spectrum;

detecting a tone of the input signal based on the extracted feature amount;

adding reverberation to the input signal based on the detected tone of the input signal, wherein for a moderate tone a longer reverberation time is set while for an ordinary tone a shorter reverberation time is set; and generating audience-generated sound based on the detection signal.

12. A non-transitory computer-readable medium having stored thereon computer-executable instructions that, when executed by a processor, cause a computer to execute operations, the operations comprising:

detecting, from an input signal, a detection signal wherein the detection signal includes at least one of an audience-generated-sound likelihood or a music likelihood;

acquiring a spectrum based on a spectral analysis on the input signal;

extracting a feature amount of the input signal based on the acquired spectrum;

detecting a tone of the input signal based on the extracted feature amount;

adding reverberation to the input signal based on the detected tone of the input signal, wherein for a moderate tone a longer reverberation time is set while for an ordinary tone a shorter reverberation time is set; and generating audience-generated sound based on the detection signal.

* * * * *